(12) United States Patent
Plummer et al.

(10) Patent No.: US 7,195,959 B1
(45) Date of Patent: Mar. 27, 2007

(54) THYRISTOR-BASED SEMICONDUCTOR DEVICE AND METHOD OF FABRICATION

(75) Inventors: James D. Plummer, Portola Valley, CA (US); Zachary K. Lee, Irvine, CA (US); Kevin J. Yang, Santa Clara, CA (US); Farid Nemati, Redwood City, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 0 days.

(21) Appl. No.: 10/958,820

(22) Filed: Oct. 4, 2004

(51) Int. Cl.
*H01L 21/332* (2006.01)

(52) U.S. Cl. .................... 438/133; 438/139

(58) Field of Classification Search ........... 438/133, 438/135, 137, 138, 139, 140
See application file for complete search history.

(56) References Cited

U.S. PATENT DOCUMENTS

| | | | |
|---|---|---|---|
| 3,856,586 A * | 12/1974 | Borchert et al. ............ 148/186 |
| 4,742,382 A * | 5/1988 | Jaecklin .................... 257/127 |
| 4,965,872 A | 10/1990 | Vasudev |
| 5,448,104 A | 9/1995 | Yallup |
| 5,559,349 A * | 9/1996 | Cricchi et al. ............. 257/273 |
| 5,627,401 A | 5/1997 | Yallup |
| 5,681,763 A | 10/1997 | Ham et al. |
| 6,087,683 A | 7/2000 | King et al. |
| 6,229,161 B1 | 5/2001 | Nemati et al. |
| 6,448,586 B1 | 9/2002 | Nemati et al. |
| 6,459,140 B1 | 10/2002 | Johansson et al. |
| 6,462,359 B1 | 10/2002 | Nemati et al. |
| 6,492,662 B2 | 12/2002 | Hsu et al. |
| 6,501,099 B2 * | 12/2002 | Shah ........................ 257/77 |
| 6,512,274 B1 | 1/2003 | King et al. |
| 6,528,356 B2 | 3/2003 | Nemati et al. |
| 6,545,297 B1 | 4/2003 | Noble, Jr. et al. |
| 6,552,398 B2 | 4/2003 | Hsu et al. |
| 6,583,452 B1 | 6/2003 | Cho et al. |
| 6,611,452 B1 | 8/2003 | Han |
| 6,627,924 B2 | 9/2003 | Hsu et al. |
| 6,653,174 B1 * | 11/2003 | Cho et al. .................. 483/133 |
| 6,787,816 B1 * | 9/2004 | Chow et al. ............... 257/710 |
| 6,888,176 B1 * | 5/2005 | Horch et al. .............. 257/107 |
| 7,075,122 B1 * | 7/2006 | Yang et al. ................ 257/163 |

OTHER PUBLICATIONS

U.S. Appl. No. 10/706,162, filed Nov. 12, 2003, Nemati et al.
F.Nemati and J.D. Plummer, A Novel High Density, Low Voltage SRAM Cell with a Vertical NDR Device, VLSI Technology Technical Digest, 1998; 2 pages.

(Continued)

*Primary Examiner*—Phuc T. Dang
(74) *Attorney, Agent, or Firm*—Fields IP, PS

(57) ABSTRACT

A thyristor-based semiconductor memory device may comprise at least a region thereof, e.g., a p-base region, having high ionization energy impurity, such as a dopant. This high ionization energy impurity within a base region may be operable to compensate for a gain-versus-temperature dependence of a constituent bipolar transistor of the thyristor element of a thyristor-based memory device. In particular embodiments, the high ionization energy impurity may include a donor and/or acceptor in silicon.

24 Claims, 31 Drawing Sheets

OTHER PUBLICATIONS

F.Nemati and J.D. Plummer, A Novel Thyristor-based SRAM Cell (T-RAM) for High-Speed, Low-Voltage, Giga-Scale Memories, Intl. Electron Device Mtg. Tech. Digest; 1999; 3 pages.

National Scientific Corp., TMOS Memory Cell, Breakthrough Technology in SRAM, at http://www.nsclocators.com/images/pdf/IP_tmos-2003.PDF, 2003.

R.Colin Johnson, Hybrid Tunnel Diodes Could Leapfrog Moore's Law, EE Times, Oct. 29, 2003, also at www.eetimes.com/at/news/OEG20031029S0015; 4 pages.

I.C. Kizilyalli, A.S. Chen, et al.; Silicon NPN Bipolar Transistors with Indium-Implanted Base Regions; IEEE Electron Device Letters, vol. 18, No. 3, Mar. 1997; pp. 120-122.

V. Subramanium, et al.; Controlled Two-Step Solid Phase Crystalization for High-Performance Poly . . . ; IEEE Electron Device Letters; vol. 18, No. 8, Aug. 1997; pp. 378-381.

H.G. Grimmeiss, E. Janzen, et al.; Tellurium donors in silicon; The American Physical Society, vol. 24, No. 8, Oct. 15, 1981; pp. 4571-4586.

H.R. Vydyanath, J.S. Lorenzo, F.A. Kroger; Defect pairing diffusion, and solubllity studies in selenium-doped silicon; J. Appl. Phys. 49 (12); Dec. 1978; pp. 5928-5937.

A.A. Taskin and E.G. Tishkovskii; Formation of Selenium-Containing Complexes in Silicon; Semiconductors, vol. 36, No. 6, 2002; pp. 605-614.

American Semiconductor, Tunnel Diode and Back Diode, at Americanmicrosemi.com; undated; 4 pages.

V. Subramanian, et al.; A Novel Technique for In-Situ Monitoring of Crystallinity and Temperature during Rapid Thermal Annealing of Thin SI-SI-GE Films . . . ; undated; 6 pages.

* cited by examiner

THYRISTOR-BASED SEMICONDUCTOR DEVICE AND METHOD OF FABRICATION

Related Data

For purposes of disclosure, cross-reference is made to "Thyristor-Based Memory and its Method of Operation", Nemati, et al., U.S. patent application Ser. No. 10/741,539 filed Dec. 19, 2003, the disclosure of which is hereby incorporated by reference in its entirety.

BACKGROUND

The present disclosure is directed to semiconductor devices and, more specifically, to thyristor-based memory that may include a thyristor having a base region implanted with a high ionization energy impurity, such as a dopant.

With the progression of semiconductor technology, semiconductor devices of ever-decreasing geometry have been realized for enabling the fabrication of integrated circuits of increased density and complexity. While this industry, in general, may be understood to address a variety of different types of circuits; the design, construction and manufacture of semiconductor memory devices—which may be used for storage of digital data—has conventionally been of particular interest to particular segments of the industry.

Most semiconductor memory devices may be described as static random access memory (SRAM) or dynamic random access memory (DRAM). SRAM's, conventionally, have been used for applications requiring quick performance and responsiveness. Quick responsiveness may be understood to enable ready availability—i.e., access speed.

In contrast, DRAM's typically have been associated with applications of reduced speed requirements. These DRAM's, although of responsiveness slower than conventional SRAM's might still have found favor by way of their density advantage—i.e., area per bit.

More recently, however, thyristors have been introduced as a type of Negative Differential Resistance (NDR) SRAM device that may offer speed potential as well as density. Additionally, some of the more recent thyristor-based memory may be capable of realization via readily available CMOS processes, procedures and equipment.

One consideration associated with design of thyristor-based memory concerns the magnitude of a thyristor's holding current—i.e., the current necessary for the device to preserve a conductive state (on-state). If such thyristor is operable with a low holding current, low power dissipation may be achieved during the overall operation of the memory device. However, these minimum current levels may depend on the desired reliability (e.g., maximum tolerable error density) and noise immunity.

The noise immunity of a thyristor-based memory cell may be related to its blocking characteristics. If the gain of the thyristor is too great, then the threshold level of the thyristor's blocking state may drop to a level that may hinder data preservation. An excessive gain may cause the thyristor to be vulnerable to noise influences, wherein the noise may erroneously trigger the thyristor from a non-conductive state to a conductive state. For similar reasons, it may be difficult to transition a thyristor of excessive gain from a conductive state to a non-conductive state.

Accordingly, a compromise may be evident when selecting a gain for the constituent bipolar devices of the thyristor element of a thyristor-based memory. The selection of a gain too low for the bipolar devices of the thyristor may hinder the ability to write and preserve data of a first type (conductive state) within the thyristor. On the other hand, the selection of a gain too great may, alternatively, hinder the ability to write and preserve data of second type (non-conductive state). Ideally, the thyristor may be designed with a bipolar gain selected for permitting reliable writing and storage of either of first-type or second-type data, and capable of reliable fabrication over given variance that may affect the gain.

However, various environmental conditions such as temperature may be understood to influence the performance of semiconductor devices. Additionally, during manufacture of thyristor-based semiconductor memory, various processes—e.g., doping, implant, activation, anneal procedures, and the like—may include tolerance levels or limitations that may contribute to device variations; and, likewise, the reliability of the thyristor-based memory to handle data with immunity to noise, environmental influences and temperature variation.

SUMMARY

According to an embodiment of the present invention, a thyristor-based memory may provide stable operation over a range of temperature conditions. A memory cell may comprise a thyristor and an access transistor to access the thyristor. A source/drain region of the access transistor may be electrically in common with the cathode-emitter region of the thyristor. A p-base region of the thyristor may define a junction relative to the cathode-emitter region, and may comprise indium dopant. In an alternative embodiment, the p-base may comprise another high ionization energy acceptor (e.g., gallium, thallium).

In a particular embodiment, the p-base region may be doped with indium primarily in the vicinity of the junction defined relative to the cathode-emitter.

In a further embodiment, the p-base may also comprise boron dopant.

In another embodiment, the memory may comprise a transistor with a gate operable to control the transistor and assist selective access of the thyristor for read and write operations. Additionally, the thyristor may comprise a capacitor electrode capacitively coupled to an indium-doped p-base region adjacent the cathode-emitter. The gate of the thyristor and/or the capacitor electrode coupled to the thyristor may be used either singly or in combination during access, read, storage or write of data from/into the thyristor.

In a further embodiment, the indium doping of the p-base region may comprise a concentration sufficient to compensate for changes in gain within the thyristor dependent on operating temperature. In some embodiments, the indium doping may influence and/or compensate the temperature dependence for the gain of a constituent bipolar transistor of the thyristor (e.g., the temperature dependence of the gain (>) can be reduced). In particular embodiments, it may serve to provide for greater reliability when writing first-type data (e.g., turning the thyristor on) at low temperatures and/or writing second-type data (e.g., turning it off) at high temperatures.

In a particular embodiment, a method for implanting indium comprises angularly implanting indium into the p-base region via an exposed cathode-emitter region.

In another particular embodiment, the method of implanting indium may comprise implanting the indium directly into the p-base region.

In another embodiment, another high ionization energy acceptor may be substituted for all or part of the indium. Such high ionization energy acceptor may comprise an element that acts as an acceptor in silicon and may be characterized by an ionization energy that is sufficiently large to influence the percentage of atoms ionized over a typical operating temperature range. In further embodiments, thallium, gallium, nickel, or cobalt may be used instead of Indium.

In another embodiment, the thyristor may comprise an NPNP device coupled to a pMOSFET. In a further embodiment, the anode-emitter region of the thyristor may be electrically in common with a drain/source region of the pMOSFET. In a particular further embodiment, the n-base region for the thyristor may be implanted with a high ionization energy impurity, such as a donor dopant of bismuth. Such high ionization energy donor may comprise an element that acts as a donor in silicon and may be characterized by an ionization energy that is sufficiently large to influence the percentage of atoms ionized in the n-base over a typical operating temperature range. In yet further embodiments, implanted impurities may form pairs and/or complexes which may act as donors in silicon and are characterized by a high ionization energy.

BRIEF DESCRIPTION OF THE DRAWINGS

The subject matter of embodiments of the present invention may be understood by reference to the following detailed description and with reference to the accompanying drawings, in which.

DETAILED DESCRIPTION

Figure 1A:
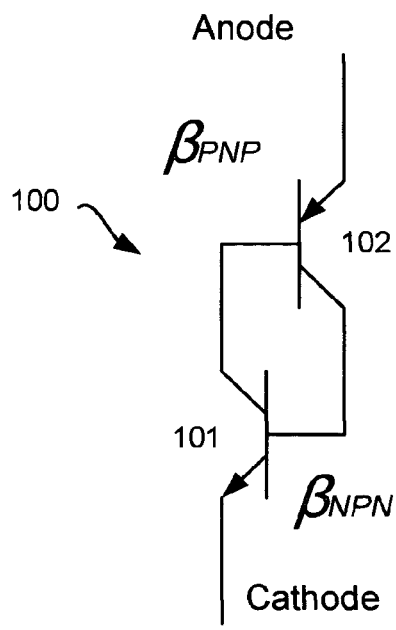
FIG. 1A is a schematic diagram of a thyristor represented with two constituent bipolar transistors as may be useful for gaining an understanding of certain embodiments of the invention.

In the description that follows, readily established circuits and procedures for the exemplary embodiments may be disclosed in a simplified form (e.g., simplified block diagrams and/or simplified description) to avoid obscuring an understanding of the embodiments with excess detail and where persons of ordinary skill in this art can readily understand their structure and formation by way of the drawings and disclosure. For the same reason, identical components may be given the same reference numerals, regardless of whether they are shown in different embodiments of the invention.

As used herein, "substrate" or substrate assembly may be meant to include, e.g., a portion of a semiconductor or bulk material. Such portion may have one or more layers of material including, but not limited to Si, Ge, SiGe, and all other semiconductors that have been formed on or within the substrate. Layered semiconductors comprising the same or different semi-conducting material such as Si/Si, Si/SiGe and silicon-on-insulator (SOI) may also be included. These layers and/or additional layers may be patterned and/or may comprise dopants to produce devices (e.g., thyristors, transistors, capacitors, interconnects, etc.) for an integration of circuitry. In forming these devices, one or more of the layers may comprise topographies of various heights. When referencing this integration of circuitry, therefore, it may be described as integrated together, on or with a substrate.

Furthermore, those skilled in the art will recognize that although embodiments of the present invention may describe fabrication with particular dopants, such as boron or indium, molecular compounds containing those dopants (e.g., $BF_2$ or compounds containing indium) may be used during particular phases of the fabrication or may serve as source for the particular dopants as may be referenced herein.

Also, as referenced herein, portions of (e.g., a transistor or thyristor) may be described as being formed in, at or on a semiconductor substrate. Such alternative terms in/at/on may be used individually merely for purposes of convenience. In the context of forming semiconductors, such terms may reference portions collectively of a semiconductor element that may be within and/or on a starting (or intermediate or handling) structure or material.

Similarly, the terms portion, area, and region, depending on context, may be synonymous. For example a portion of a device may again, depending on the context, also accurately be referred to as an area of the device or as a region of the device. In a particular context, one synonymous term may be chosen instead of another merely for purposes of convenience. Further, a first region, depending on context, might also overlap a second region.

Referencing FIG. 1A, a thyristor 100 may be simplistically represented or modeled as comprising an NPN transistor 101 and a PNP transistor 102 cross-coupled base-to-collector and collector-to-base. The current gain $\beta_{NPN}$ and $\beta_{PNP}$ associated with these constituent transistors may influence operating characteristics of the thyristor.

When applying a voltage to the anode, the thyristor may initially resist current flow to sustain, e.g., a non-conductive state, as represented by a segment of the thyristor's I-V characteristic curve 200 (FIG. 2) between its zero-state bias 202 and second bias 204 at an applied voltage less than its characteristic blocking threshold voltage $V_{BO}$. Upon exceeding the blocking threshold voltage $V_{BO}$, the thyristor may (abruptly) transition beyond its "blocking-knee" 206 to a conductive region as represented by the bias-point 208, e.g., of a one-state condition.

Although, data may be described as "one-data" and "zero-data" for the "conductive" and "non-conductive" bias regions of the thyristors, these data states might be understood to be of alternative polarity for these simplified biasing conditions.

Figure 1B:
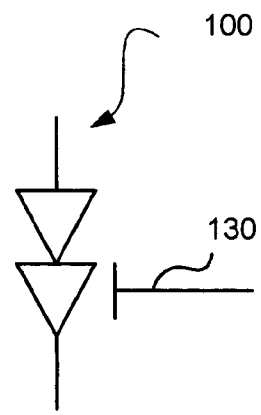
FIG. 1B is an alternative schematic diagram representing a capacitively coupled thyristor, useful to gain an understanding of certain embodiments of the invention.

Further referencing FIG. 1B, a thyristor for a memory application, for example, may incorporate electrode 130 capacitively coupled to a base region of the thyristor. By applying voltage modulation to electrode 130, certain thyristor operations may be assisted.

For purposes of this disclosure, it may be understood that certain parameters of the thyristor can impact its operating characteristics. Some of these parameters may include, e.g., the doping levels of the anode-emitter, n-base, p-base and cathode-emitter regions of the thyristor in addition to their physical thickness, width and length, and the like.

Figure 3A:
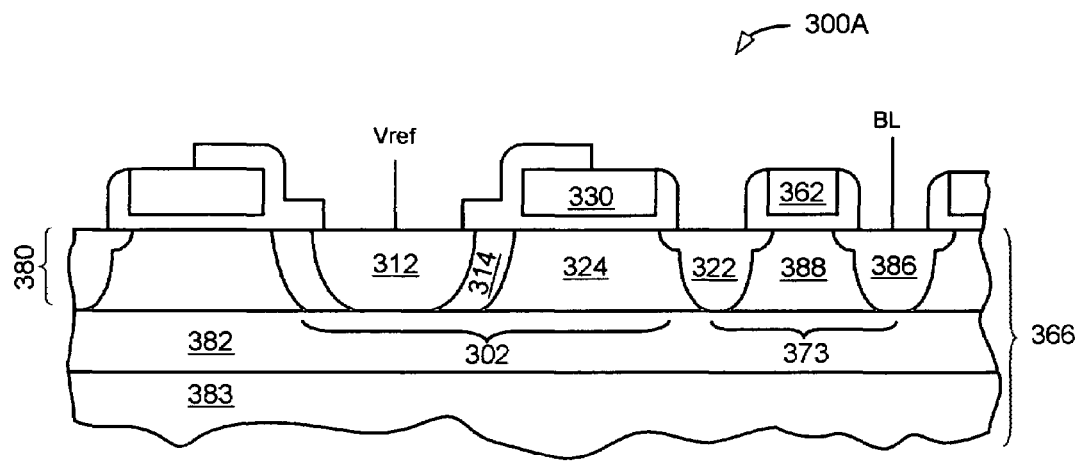
FIG. 3A is a simplified cross-sectional view of a portion of thyristor-based memory illustrating an access transistor to access a capacitively coupled thyristor of a silicon-on-insulator (SOI) realization as may be associated with embodiments of the invention, showing a cathode-emitter region in common with a source/drain region.

Relative to thickness, referencing FIG. 3A, capacitively-coupled thyristor 302 may be formed in a contiguous serial arrangement with access transistor 373 within a thin "layer" of silicon 380 associated with SOI substrate 366. The thyristor and transistor together may define, at least in part, a portion of a thyristor-based memory 300A. If sufficiently thin, appropriate bias of capacitor electrode 330 may fully deplete carriers from the base region 324 of the thyristor.

For example, when transitioning the thyristor from a conducting state 208 (FIG. 2) to a non-conducting state 202, it may be desirable to temporarily increase the voltage of the capacitor electrode 330 before transitioning to a lower voltage in order to assist depletion of residual minority carriers that may be present in the base region. Otherwise, a longer duration might be required for the associated memory element to fully transition from a conducting to a non-conducting condition, which might thus make the latency of the memory device (e.g., write speed) greatly dependent on the typical recombination or lifetime characteristic of the respective carriers within the base region.

Figure 2:
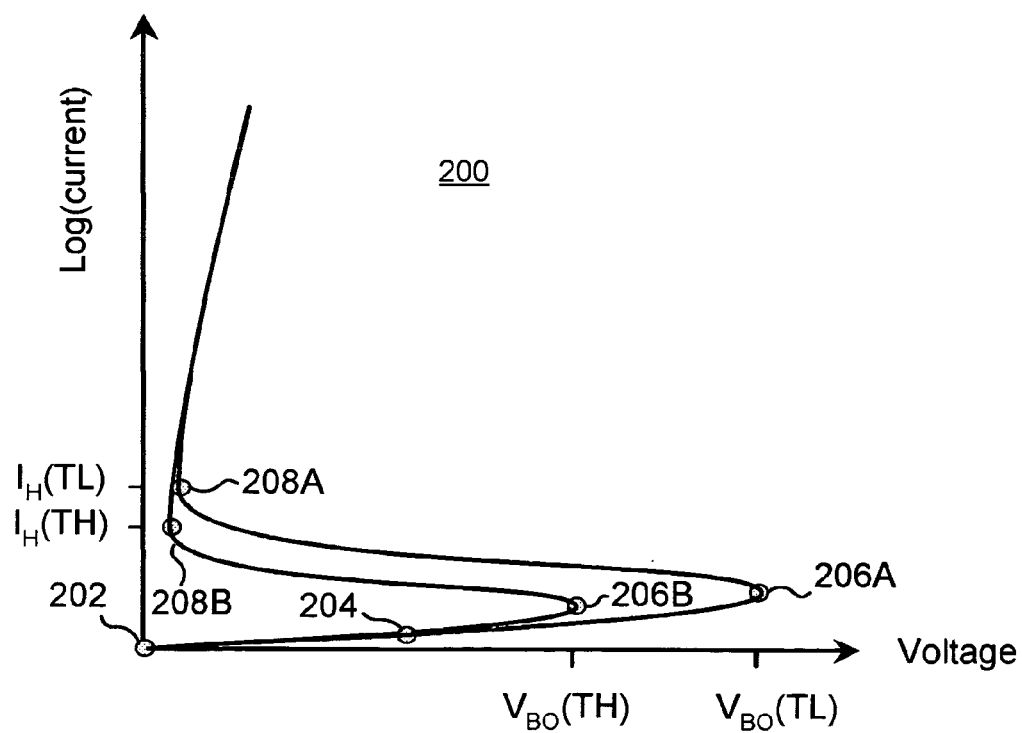
FIG. 2 is a graph illustrating a current curve characteristic of a thyristor device, useful for gaining an understanding of certain embodiments of the invention.

Further referencing FIGS. 2 and 3A; the lateral length and doping provisions of the different regions of the thyristor 302 may also affect the thyristor operation. The blocking threshold voltage $V_{BO}$ for the thyristor and the holding current $I_H$ required between different states may depend on the gain of the constituent bipolar devices, which in-turn may depend on the length and doping density ratios between base 324 (or 314) and relative to emitter region 322 (and 312). The amount of dopant provided for a base region within its associated base integral length relative to the amount of dopant provided for an emitter region within its associated emitter integral length may establish the gain to the bipolar device. Accordingly, designs for establishing a given gain for a bipolar device may target a certain ratio between the integrated base doping and the integrated emitter doping (known as the base and emitter Gummel numbers, respectively) and may be guided by principles of known Gummel number teachings available from bipolar transistor theory. In general, it may be understood that a device designed for a short base and/or light base doping may achieve a high $\beta$. Likewise, high emitter doping could also contribute to gain.

In the embodiment described relative to FIG. 3A, the cathode-emitter region 322 for the thyristor 302 may be in common with drain/source region 322 for access transistor 302. Referencing FIG. 3B, in an alternative embodiment, isolation 321 may be disposed between separate cathode-emitter region 322A and separate drain/source region 322B. Separate cathode emitter region 322A may be electrically interconnected by an interconnect 319 (e.g., separate metal layer) with drain/source region 322B for access transistor.

Figure 3B:
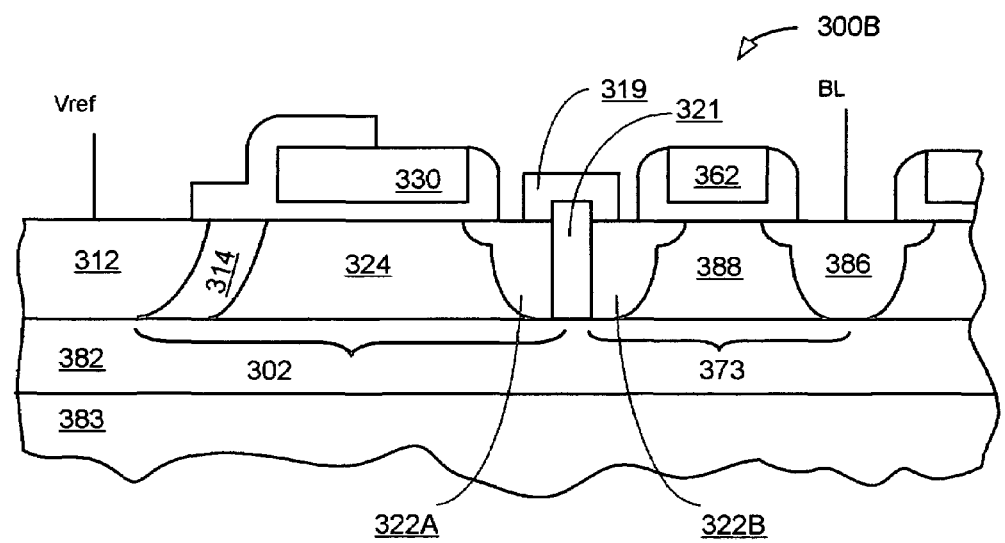
FIG. 3B is a simplified cross-sectional view of a portion of thyristor-based memory illustrating an access transistor to access a capacitively coupled thyristor of a silicon-on-insulator (SOI) realization as may be associated with embodiments of the invention, showing an interconnect coupling a cathode-emitter region to a source/drain region.

In the embodiments described relative to FIGS. 3A and 3B, the thyristor-memory was illustrated as a horizontally constructed device on a Silicon On Insulator (SOI) substrate. However, it may alternatively be constructed with vertical structures or mixed vertical/horizontal structure.

Figure 3C:
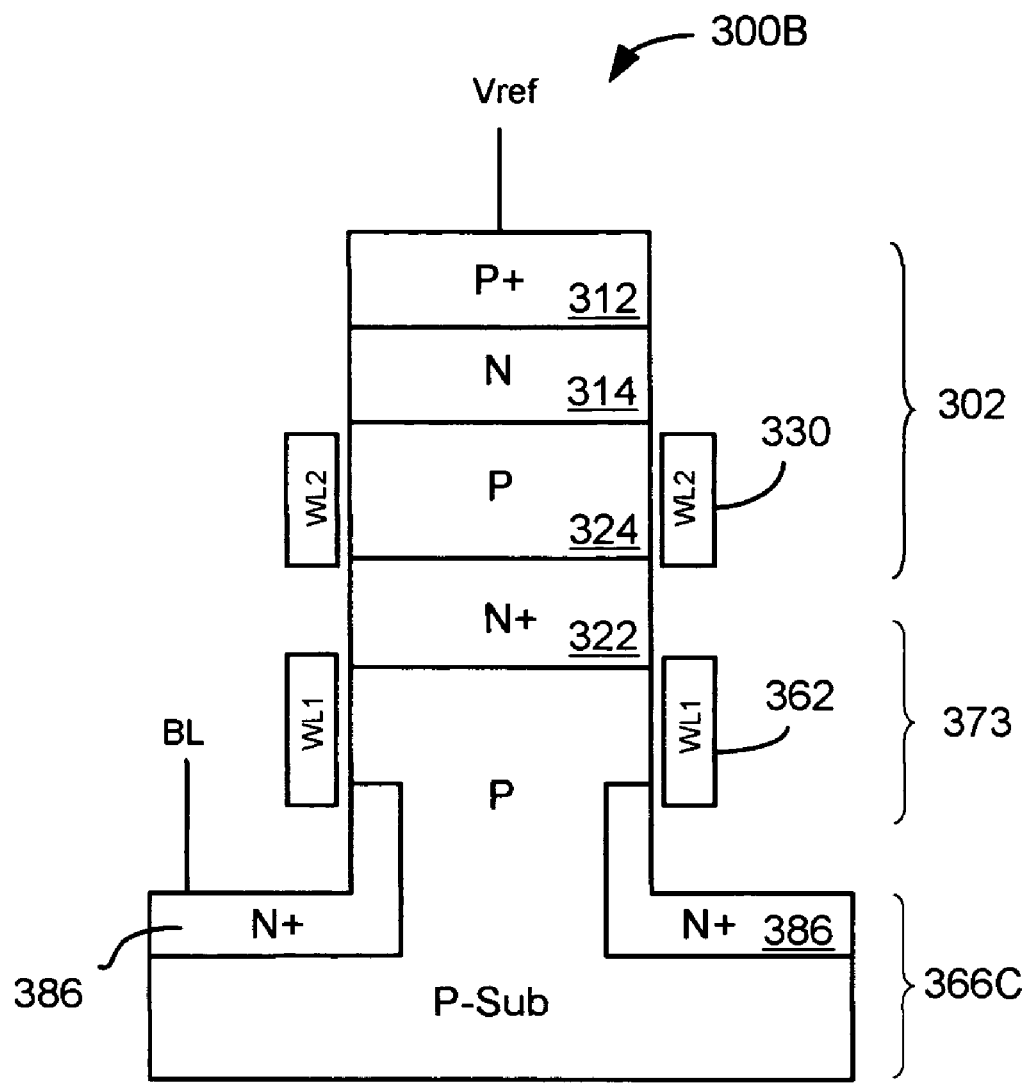
FIG. 3C is a simplified cross-sectional view of a portion of a thyristor-based memory illustrating a pillar realization of a capacitively-coupled thyristor in series with an access transistor as may be associated with certain embodiments of the invention.
Figure 3D:
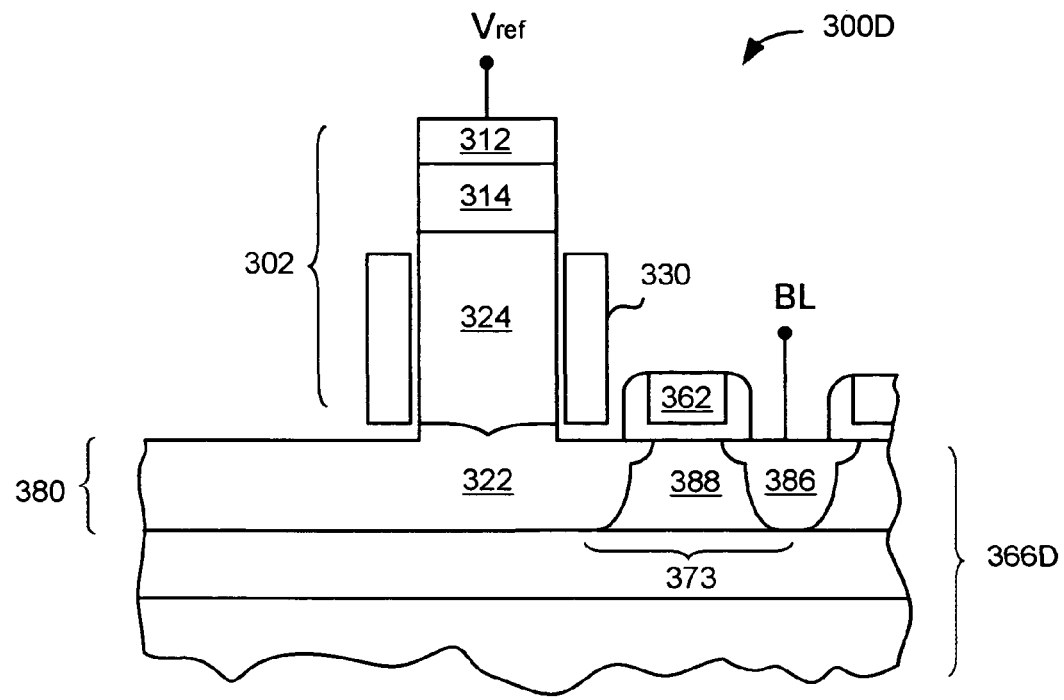
FIG. 3D is a simplified cross-sectional view of a thin capacitively-coupled thyristor of another pillar realization as may be associated with certain embodiments of the invention.

For example, referencing FIGS. 3C and 3D, alternative examples for thyristor configurations of thyristor-based memory devices 300C and 300D may include pillar structures. In a particular example, anode-emitter 312, N-base 314, P-base 324 and cathode-emitter 322 may be disposed in sequential contiguous relationship within a pillar of semiconductor material that may extend vertically or perpendicularly to a plane defined by a supporting substrate such as substrate 366B or SOI substrate 366C.

For one embodiment, referencing FIG. 3C, portions of the body and source/drain regions for an access transistor 373 may be disposed as part of the pillar structure and electrically in series with the thyristor 373. In contrast, referencing FIG. 3D, a mixed vertical/horizontal structured thyristor-based memory 300D may comprise an access transistor 373 disposed in a layer of silicon of (e.g., an SOI) substrate, while, for this embodiment, the drain/source region 322 of the access transistor 373 may be formed in common with the cathode-emitter region 322 for thyristor 302.

Figure 3E:
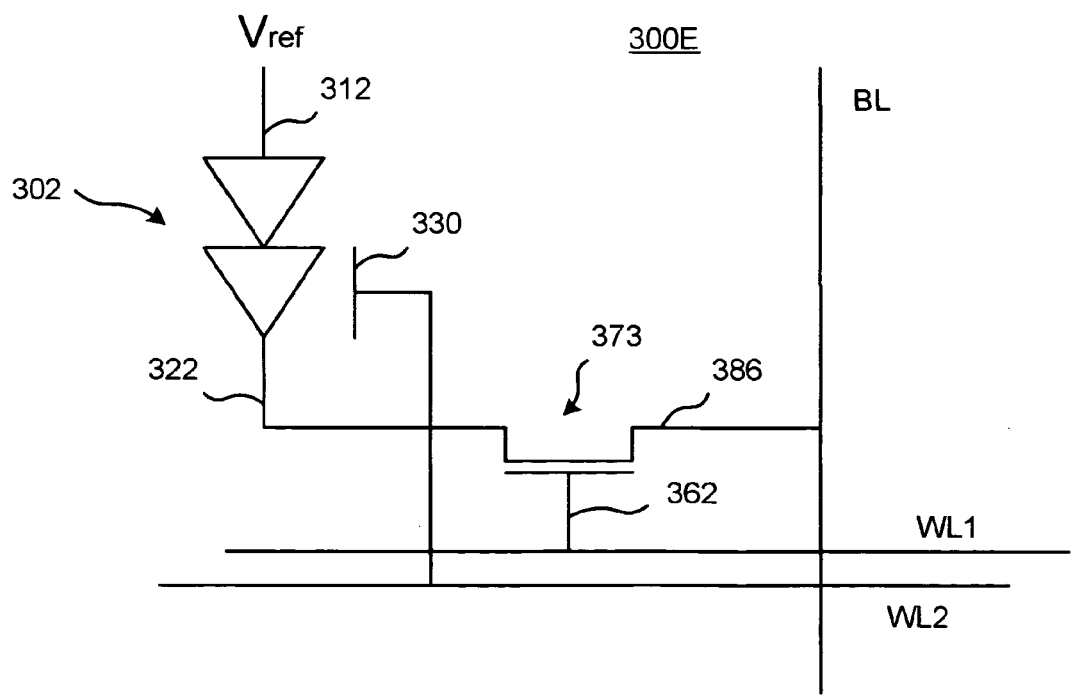
FIG. 3E is a schematic representation of a thyristor-based memory comprising an access transistor to access a capacitively-coupled thyristor, as may correspond to a variety of physical structure realization(s).

Referencing FIG. 3E, thyristor-based memory embodiments may be represented schematically as a memory cell, which, in turn, may define part of an overall memory array 300E. Anode region 312 of thyristor 302 may be coupled to receive the reference voltage $V_{REF}$ and the cathode-emitter region 322 may be coupled electrically to a drain/source of access transistor 373. The alternate side of MOSFET 373 (the source/drain region 386) may be coupled to a bit line BL operable for carrying signals to/from other read/write circuits of, e.g., further logic (not shown) of an extended memory array. In this example, gate 362 of the access transistor may be coupled to an access control line that may be referenced as a first wordline WL1, while capacitor electrode 330 (capacitively coupled to a base region of thyristor 302) may be coupled to another control line that may be referenced as a second wordline WL2. Again, it may be understood that the thyristor and the access transistor for a thyristor-based memory cell may form part of an overall memory array 300E, in which the memory array may comprise a plurality of such wordlines and bitlines of a row and column architecture.

When operating thyristor-memory over a range of temperature, the gain of the typical constituent bipolar devices of the thyristor element may typically increase with increasing temperatures and decrease with decreasing temperatures. At a low operating temperature, the bipolar elements of the typical thyristor may show a reduced gain, which could make it more difficult to write a first-state or turn the thyristor on. Alternatively, at higher operating temperatures, the bipolar devices of the thyristor may exhibit increased gain, which may make it difficult to write or maintain a second-state condition (zero data).

Figures 4A, 4B:
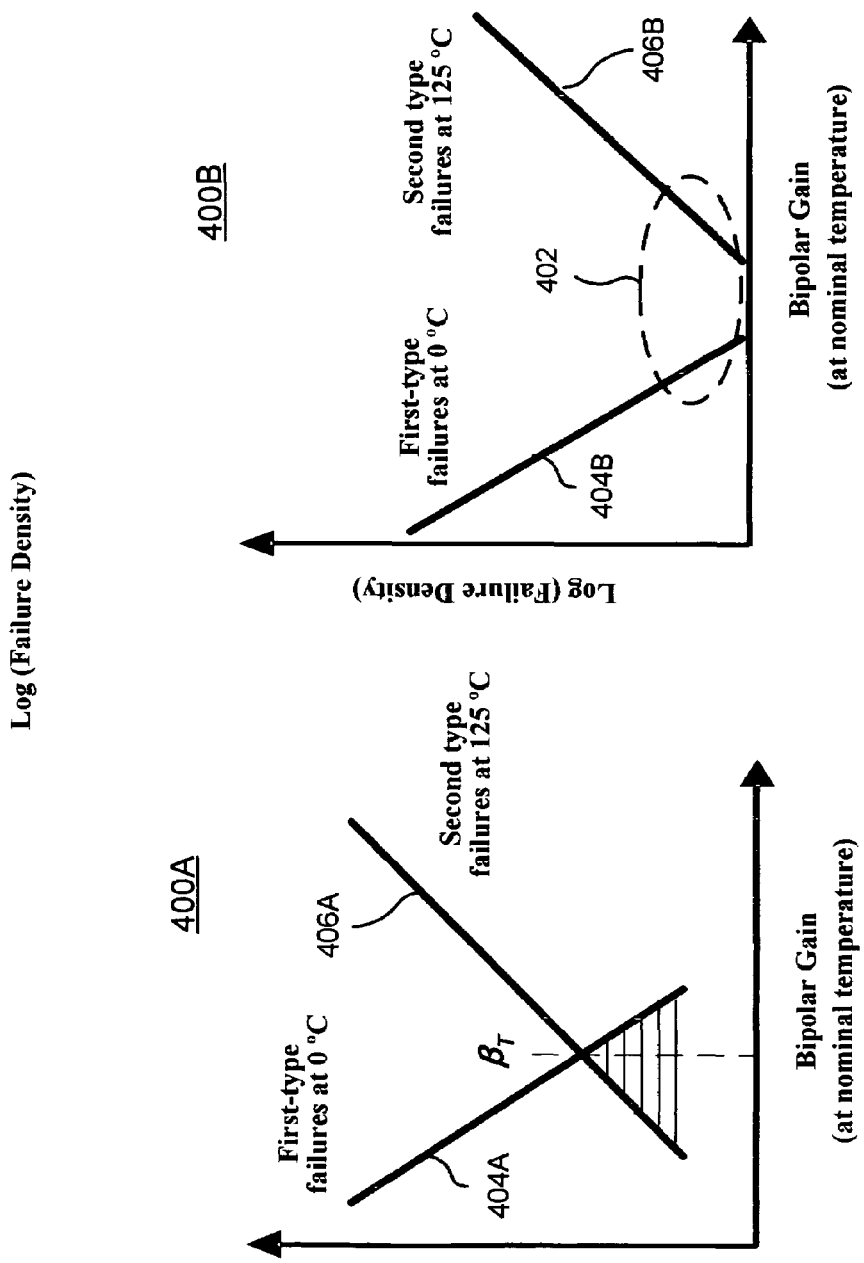
FIG. 4A is a simplified exemplary design template showing a first "error-density versus gain" curve for mapping first-type failures at a low-temperature operating condition for a typical thyristor-based memory and a second "error-density versus gain" curve for modeling second-type failures at a high-temperature operating condition, which combined representation might be used to illustrate a target gain design region as may be associated with a narrow region capable of offering acceptable yield of perhaps marginally reliable thyristor-based memory.
FIG. 4B is a simplified exemplary design template for a thyristor-based memory as may be available according to an embodiment of the present invention, showing a first "error-density versus gain" curve for mapping first-type failures at a low-temperature operating condition relative to a second "error-density versus gain" curve for modeling second-type failures at a high-temperature operating condition as may be useful to illustrate a target gain design region that may offer more acceptable yield and/or reliable thyristor-based memory operation in comparison to prior art devices described relative to FIG. 11B.

To understand this principle, reference may be made to a design template 400A (FIG. 4A). Such typical template 400A may be understood to assist selection for a target gain beta ($\beta$) in the fabrication of typical thyristor memory devices, wherein the gain or beta ($\beta$) selections may be represented along an x-axis. The constituent bipolar device of a thyristor, therefore, may be made with the aid of modeled error probabilities for thyristor operation across temperatures.

First curve 404A for the design selection template 400A, further referencing FIG. 4A, may characterize a probable error density or error distribution of a thyristor device for first-type data (e.g., one-state data in this example) when operating at a low temperature, such as 0° C. For such conduction, it may be observed that by selecting a sufficiently high target gain for the nominal performance of the constituent bipolar devices of the thyristor, that the writing and/or preservation of first-type data may be readily achieved with low failure density. On the other hand, to maintain a low error probability for second-type data (zero data in this example), when operating the typical device at high temperature, the second-type data failure density curve 406A may suggest a desire for selecting a design targeting low gain.

Accordingly, a compromise may seem to exist between a desire for selecting a low gain design solution for the thyristor to assist preservation of second-type data at high temperature operation and an opposing desire for selecting a design solution for the thyristor of high gain that may assist the preservation of first-type data at low temperature operation. Sometimes, a narrow design window about a target gain ($\beta_T$) may exist for thyristor fabrication, which may accommodate a given range of operating temperatures.

Obtaining a reliable design solution, however, may seem more difficult when taking into consideration the variances or tolerances of the processing steps that may be associated with the production of semiconductor devices. These variances or tolerances may have the effect of sliding actual gain realizations away from a targeted gain e.g., ($\beta_T$ of FIG. 4A) so as to potentially result in yielding devices of excess error probabilities and perhaps low production yield for the resulting thyristor-based memory devices.

Figure 5A:
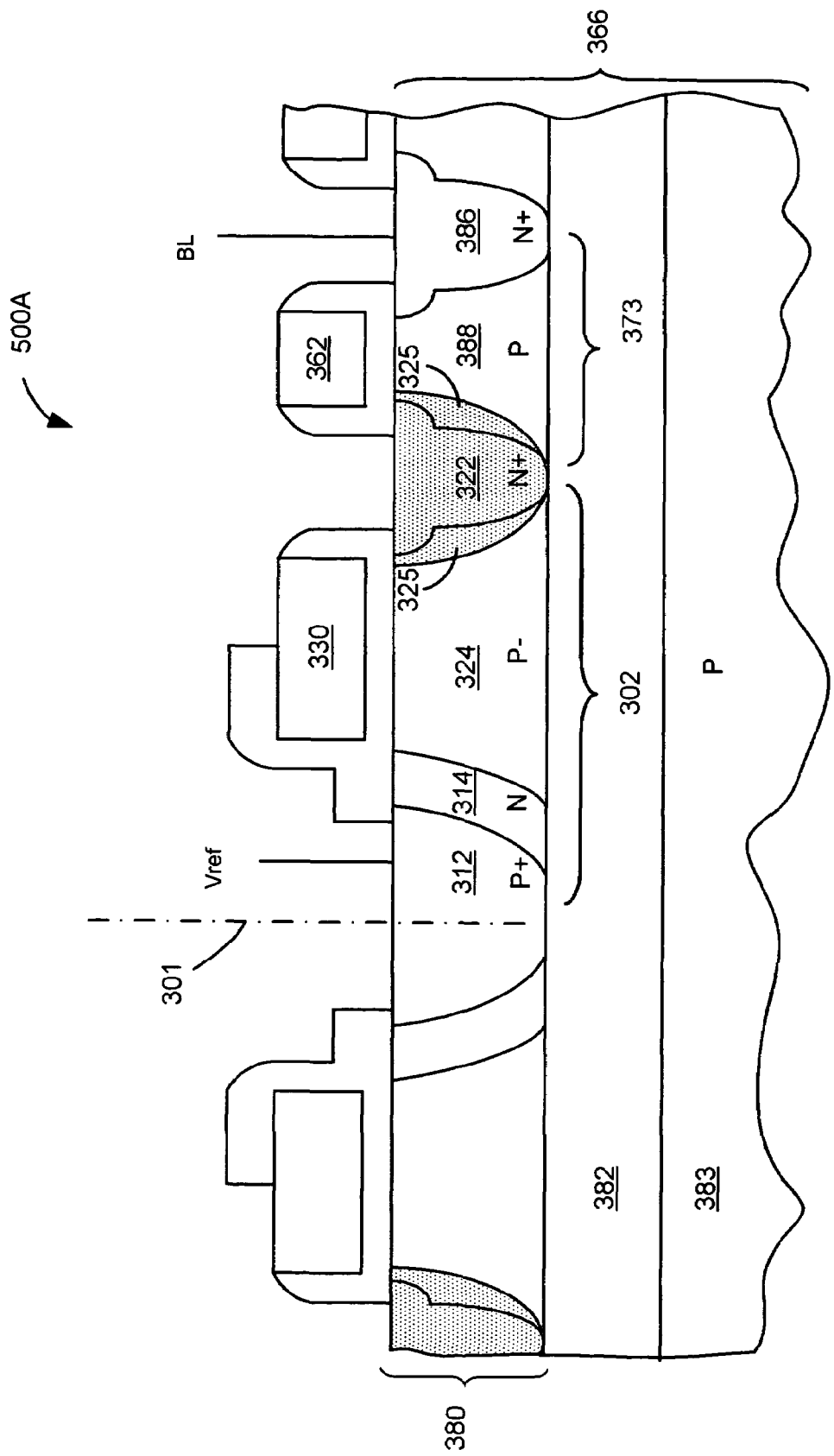
FIG. 5A is a simplified cross-sectional view of a thyristor-based memory comprising an access transistor to access a capacitively-coupled thyristor comprising a p-base region with a portion having high ionization energy acceptor (area shaded), according to an embodiment of the present invention.
Figure 5B:
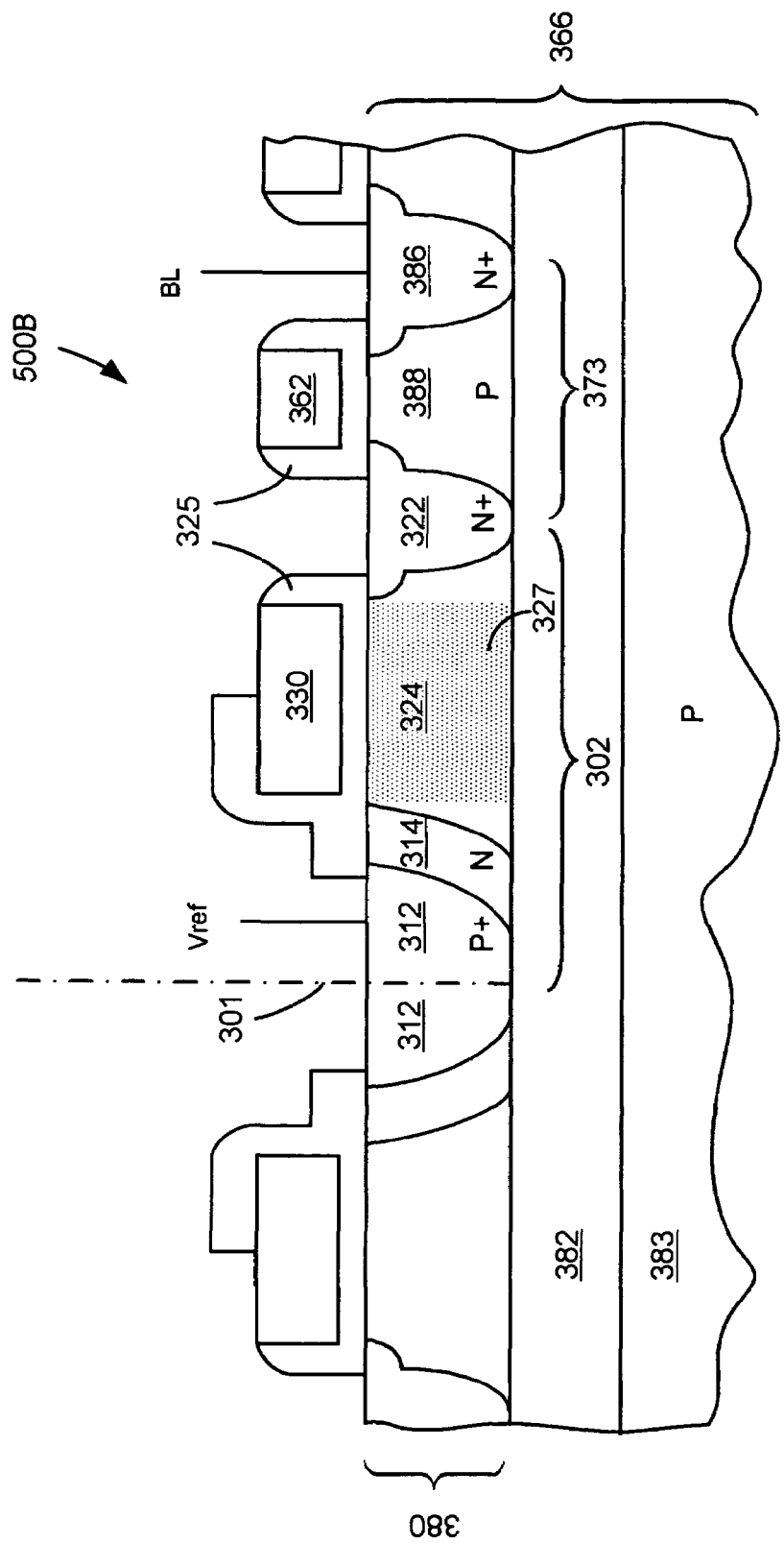
FIG. 5B is a simplified cross-sectional view of a thyristor-based memory showing a p-base region having a portion beneath the electrode that also includes high ionization energy acceptor (area shaded), according to another embodiment of the present invention.

Referencing FIGS. 5A and 5B, in accordance with two embodiments of the present invention, a thyristor-based memory 500A or 500B may comprise a thyristor 302 and access transistor 373 within a top semiconductor layer 380 of SOI substrate 366. The thyristor 302 may be a pnpn device comprising anode-emitter 312, n-base 314, p-base 324, and cathode-emitter 322 regions. The access transistor 373 may comprise an n-channel MOSFET device comprising a source/drain 322, body 388, and drain/source 386 regions. In a particular embodiment, cathode-emitter region 322 may be electrically in common with source/drain 322. Further referencing FIGS. 5A and 5B, in a further embodiment, the regions may be physically in common (e.g., in at least partially overlapping physical space). In another further embodiment, these separate regions may be electrically interconnected by an interconnect (e.g., conductive material over and across an isolation trench between the devices).

Again referencing FIGS. 5A and 5B, P-base region 324 may be capacitively-coupled via an intermediate dielectric to a capacitor-electrode 330. Anode-emitter region 312 may be electrically coupled to a supply node to receive an anode voltage (Vref). The body 388 of transistor 373 may be capacitively-coupled to gate electrode 362 and drain/source region 386 may be electrically-coupled to a bit line (BL). Typically, gate electrode 362 may laterally overlap edges of drain/source 322 and source/drain 386 regions, while the capacitor electrode 330 over the p-base region 324 may remain laterally short of the neighboring n-base 314 (and, optionally, cathode-emitter region 322).

In some embodiments, typically, upper semiconductor layer 380 may comprise multiple regions as described above for multiple memory cells (500A or 500B). Of the multiple memory cells (500A or 500B), two neighboring thyristors may perhaps share a common anode-emitter region 312. FIGS. 5A and 5B depict an imaginary boundary line 301 between the two thyristors, which may perhaps aid understanding of organization of the cells and their devices within an overall semiconductor layer 380.

Further referencing FIGS. 5A and 5B, a portion (i.e., illustrated as the shaded portion or region) of p-base region 324 may comprise indium or other high ionization energy acceptor. Indium implants (325 in FIGS. 5A and 327 in FIG. 5B) may affect the gain of the constituent npn bipolar transistor 314, 324, 322 of thyristor 302 over a given operating temperature. That is, the indium may influence and/or compensate for an otherwise increased effective bipolar gain of the thyristor 302 that would change (in the absence of the indium) with respect to an increase in operating temperature. Stated alternatively, the indium (or alternative high ionization energy acceptor) may influence and/or compensate for a decreased effective bipolar gain of the thyristor 302 that might otherwise be affected by a decrease in operating temperature. Thus, the error density for first-type errors for these indium-treated thyristor devices may be reduced when operating at low temperatures as compared to thyristor-based memories without such indium-implanted base for the thyristor. Likewise, the error density relating to second-type errors for these indium-doped thyristor devices may be lower at high operating temperatures as compared with thyristor-based memory without an indium-doped base for the thyristor. It may therefore be possible to reliably write a one (turn the device on) and write a zero (turn the device off) over a wide range of operating temperatures. Although described in this example as writing one and zero by turning the thyristor on and off respectively; it will be understood that other embodiments may reverse these data attributes.

Further referencing FIGS. 5A and 5B, in an alternative embodiment, a thyristor-based memory may comprise an NPNP thyristor in series with a PMOSFET. In a particular embodiment, the P-type anode-emitter region of the thyristor may be electrically in common with the source/drain region of the PMOSFET. In this example, therefore, the base region 324, further referencing FIGS. 5A and 5B, may comprise N-type dopant for forming an N-base (instead of a p-base region as was described previously herein). This N-base 324 beneath the electrode may thus serve as the base to a constituent pnp bipolar transistor 314,324,322. In this embodiment, this bipolar transistor may be the device of the highest gain within the thyristor 302. Stable operation over a range of temperatures may be achieved by implanting this base region of alternative dopant type with a high ionization energy donor (e.g., bismuth, sulfur, selenium, tellurium), similarly as previously described herein relative to the other embodiments, but with alternative type dopant—e.g., compare with the previously described embodiments, which may have used indium for the high-ionization energy acceptor.

In particular embodiments, further referencing FIG. 5B, the indium doping may be operable to affect the gain, per Gummel number relationships of the base region relative to that of the emitter region—e.g., p-base region 324 relative to cathode-emitter region of the constituent npn bipolar transistor 314, 324, 322 of thyristor 302.

It may be theorized that most of the electrons of a semiconductor may reside within a range of energy levels referred to as the valence band. An electron may acquire a sufficient minimum quantum of energy ($E_g$) to jump to the next higher energy level, which may be in the conduction band. This amount of energy, Eg, may be described as a "band gap". Generally, $E_g$ is inversely related to the ability of a material to conduct electricity. For example, insulators may be understood to have very high band gap energies (i.e., $E_g$>5 eV) and therefore the probability of an electron jumping to the conduction band of the insulator may be described as very low. In contrast, semiconductor materials may have band gap energy characteristics of magnitude less than insulators. In the case of silicon, it may be characterized by, for example, $E_g$=1.12 eV. When an electron jumps to the conduction band, the event may be further characterized as leaving behind a "hole" (in the valance band).

For p-type doped semiconductors, the energy required to form a hole (e.g., for a dopant atom to capture an electron from the valence band of the silicon crystal) may be described as the "ionization energy." Generally, this may be described as ionization energy and as being much less than the band gap energy. For purposes of assisting further disclosure, it may be theorized that an indium doping of the p-base region 324 may lend properties of indium to the base region that may be different from those of traditional trivalent dopants, such as boron. In further terms, the ionization energy needed for an electron to jump from the valence band to the acceptor-type impurity "level" for an indium-doped semiconductor material may differ from that of strictly boron-doped semiconductor. For silicon implanted with boron, the ionization energy may be as low as 0.045 eV. Thus, boron may be understood to be characterized by a low ionization energy value relative other dopants to silicon. In contrast, the indium when implanted into silicon may be characterized by an ionization energy as large as 0.16 eV.

It may be further theorized that, for purposes of assisting additional disclosure, implanted boron may nearly fully ionized at typical operating temperatures. That is, the hole concentration of boron-implanted semiconductor material may be about equal to the concentration of implanted boron atoms. On the other hand, because indium exhibits a higher ionization energy, it may be understood that a lower proportion of the atoms are ionized at room temperature. Accordingly, the resulting hole concentration effected within the semiconductor material by the indium dopant (alone) may be significantly less than the concentration of implanted indium atoms. It may be understood, therefore, to impart a lower effective doping level. Thus, a high ionization energy acceptor may comprise an element that acts as an acceptor in silicon and may be characterized by an ionization energy that is sufficiently large to influence the percentage of atoms ionized over a typical operating temperature range.

For an n-doped region, the effect of implanting with a high-ionization energy donor may operate in complementary relationship to that described herein with respect to a p-type region implanted with a high-ionization energy acceptor. Such high ionization energy donor may comprise an element that acts as a donor in silicon and may be characterized by an ionization energy that is sufficiently large to influence the percentage of atoms ionized over a typical operating temperature range. As discussed below with reference to FIG. 19, some types of dopants may also form pairs (e.g., $Se_2$, $Te_2$, etc.) and/or complexes of three or more atoms (e.g., $Se_n$, $Te_n$, etc.) which are characterized by different ionization energies.

In other embodiments, a high-ionization energy acceptor may be implanted into an n-type region at a dosage sufficient to change the polarity of the region to p-type. Similarly, in yet other embodiments, the high-ionization energy donor may be implanted into a p-type region at a dosage of sufficient magnitude to change the polarity of the region to n-type.

Relative to further embodiments comprising a PNPN device with a p-base implanted with a high-ionization energy acceptor, cobalt, gallium, nickel, thallium and perhaps other elements may also be viewed as types of acceptors of high ionization energy characteristics within silicon. These elements, therefore, may collectively be referred to as "high ionization energy acceptors". Accordingly, the resulting hole concentration for the semiconductor material when doped with a high ionization energy acceptor may also be significantly less than the concentration of implanted acceptor atoms, which in turn may also be understood to impart overall a lower effective doping level. For purposes of simplification and ease of understanding, however, indium doping may be described with reference to a particular embodiment.

Given the partial ionization properties for indium (and/or other high ionization energy acceptors) at typical semiconductor operating temperatures, it may be described as comprising a phenomenon of "impurity freeze-out". At higher operating temperatures, a higher proportion of the indium may ionize so as to increase an effective doping level at the increased temperatures. Briefly, as temperature increases, the silicon electrons may gain more energy such that a greater percentage of the indium atoms may be ionized with increased temperature. This, in turn, may impart a higher effective p-base doping level so as to diminish the overall gain for the device at the higher operating temperature. An effective amount of indium implant might thus be determined by which to compensate for an otherwise (e.g., typical) temperature-dependent gain of a constituent bipolar device of the thyristor element of a thyristor-based memory device.

Thus, the determined amount of indium may be implanted into a p-base of a thyristor to flatten its gain dependency relative to temperature. The resulting device may, therefore, show reliable thyristor-based memory operation over a wide range of operating temperatures. Stated differently, it may be possible to more reliably write a zero (e.g., turn-off the thyristor) at high operating temperatures and to more reliably write a one (e.g., turn-on the thyristor) at low operating temperatures. Thus, the indium may make the thyristor operation within a thyristor-based memory device more consistent for enabling a reduced error density over a wider range of temperatures than that which might otherwise be available at the low and/or high temperature conditions.

Figure 6:
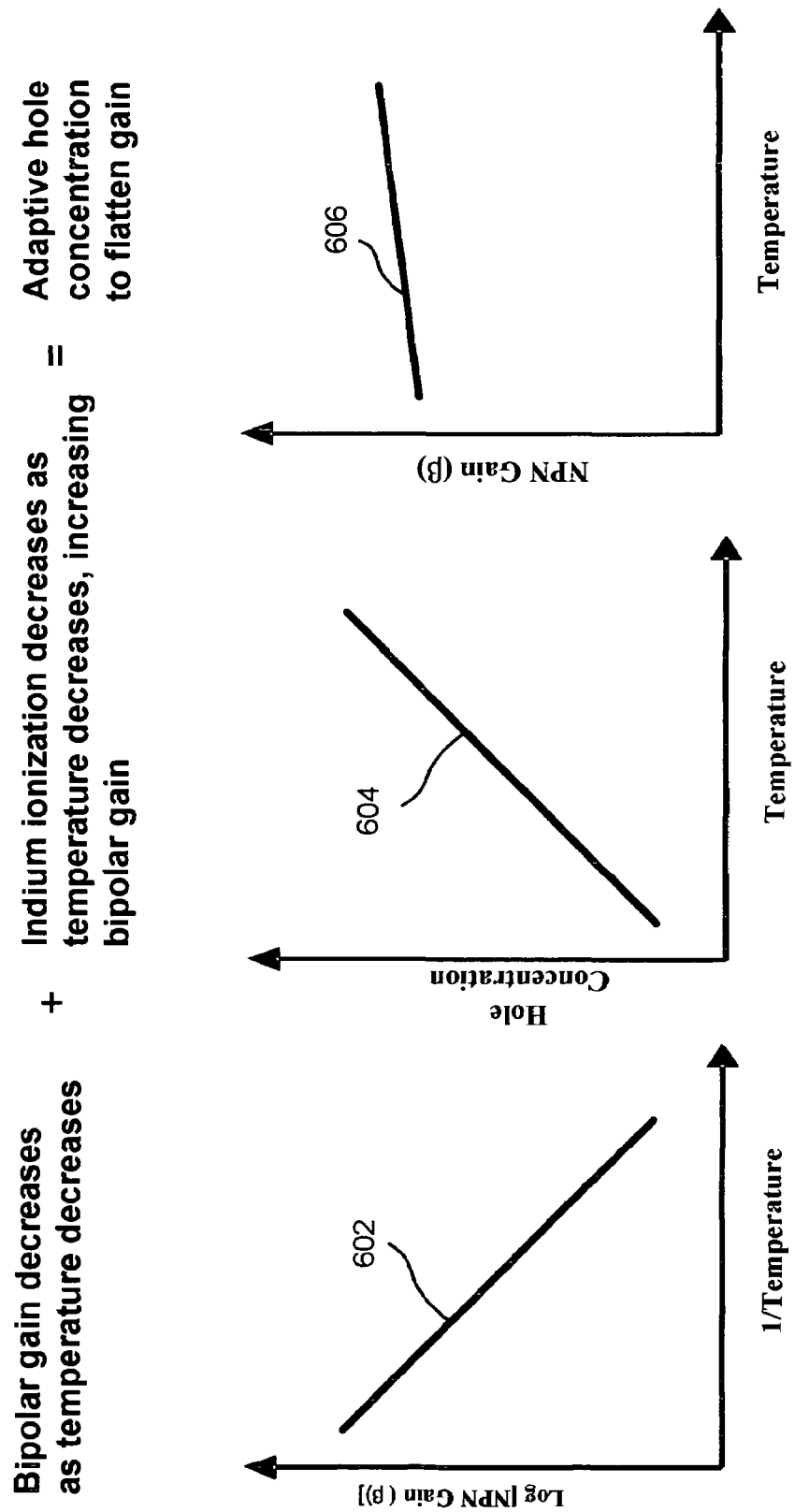
FIG. 6 is a simplified graphical-superposition model portraying combined operative effect for yielding a compensated "flat gain vs. temperature" property for bipolar devices of a thyristor memory, in which the super-positioned combination of the "bipolar gain versus temperature" characteristic and the "indium ionization rate's effect on bipolar gain as a function of temperature", as may assist an understanding of some characteristics that may be associated with certain embodiments of the present invention.

Such operative gain-compensation effects may be characterized with reference to graphical depictions as presented in FIG. 6. For example, a first curve 602 may represent a typical bipolar gain of (simple boron dopant) decreasing gain with decreasing temperature. Referencing a compensating bias curve 604, for an indium-implant influence to the base, this contributory temperature may be described as imparting decreased (indium) hole concentration with decreasing temperature, thus having the effect of increasing the resulting gain of the device at the lower temperatures. The resulting compensated gain 606 might thus appear flat across a given temperature range. Accordingly, an indium-implanted base may be described as compensating the gain dependence with respect to temperature therefor for achieving more stable and reliable thyristor-based memory operability.

In alternative embodiments, other high ionization energy acceptor (e.g., cobalt, gallium, nickel, thallium) may be substituted for the indium. For example, referencing FIG. 4A for such embodiments, gain-effecting region 325 of the thyristor (as a portion of p-base 324) may be implanted with such alternative high ionization energy acceptor (e.g., cobalt, gallium, nickel, thallium) either wholly or in part for the indium.

Further referencing FIG. 5A, the indium or other high ionization energy acceptor may be implanted into a portion 325 of p-base region 324 proximate the junction defined between p-base region 324 and cathode-emitter region 322.

In another embodiment, referencing FIG. 5B, the indium or other high ionization energy acceptor may be implanted into a majority portion 327 or most of the substantial width and thickness of p-base region 324.

In other embodiments, the implanted indium (or other high ionization energy acceptor) may be implanted into additional regions or extents thereof. Further, for example, depending on the implantation technique, the masking used, or other factors, the distribution thereof may vary within the affected regions of the thyristor. In another embodiment, the indium-implanted portion of p-base region 324 may extend along only a partial length of the junction defined between p-base region 324 and cathode-emitter region 322.

In another embodiment, the indium-implanted portion of p-base 324 may comprise an upper-half or surface region of p-base 324 as may be disposed near the surface of the p-base beneath and relative to electrode 330. In yet another embodiment, the indium may be implanted (e.g., as a buried implant) into a lower region of p-base 324 (relative electrode 330), which may be disposed near a boundary defined between p-base 324 and insulator 382 (of, e.g., an SOI substrate 366).

Figure 7A:
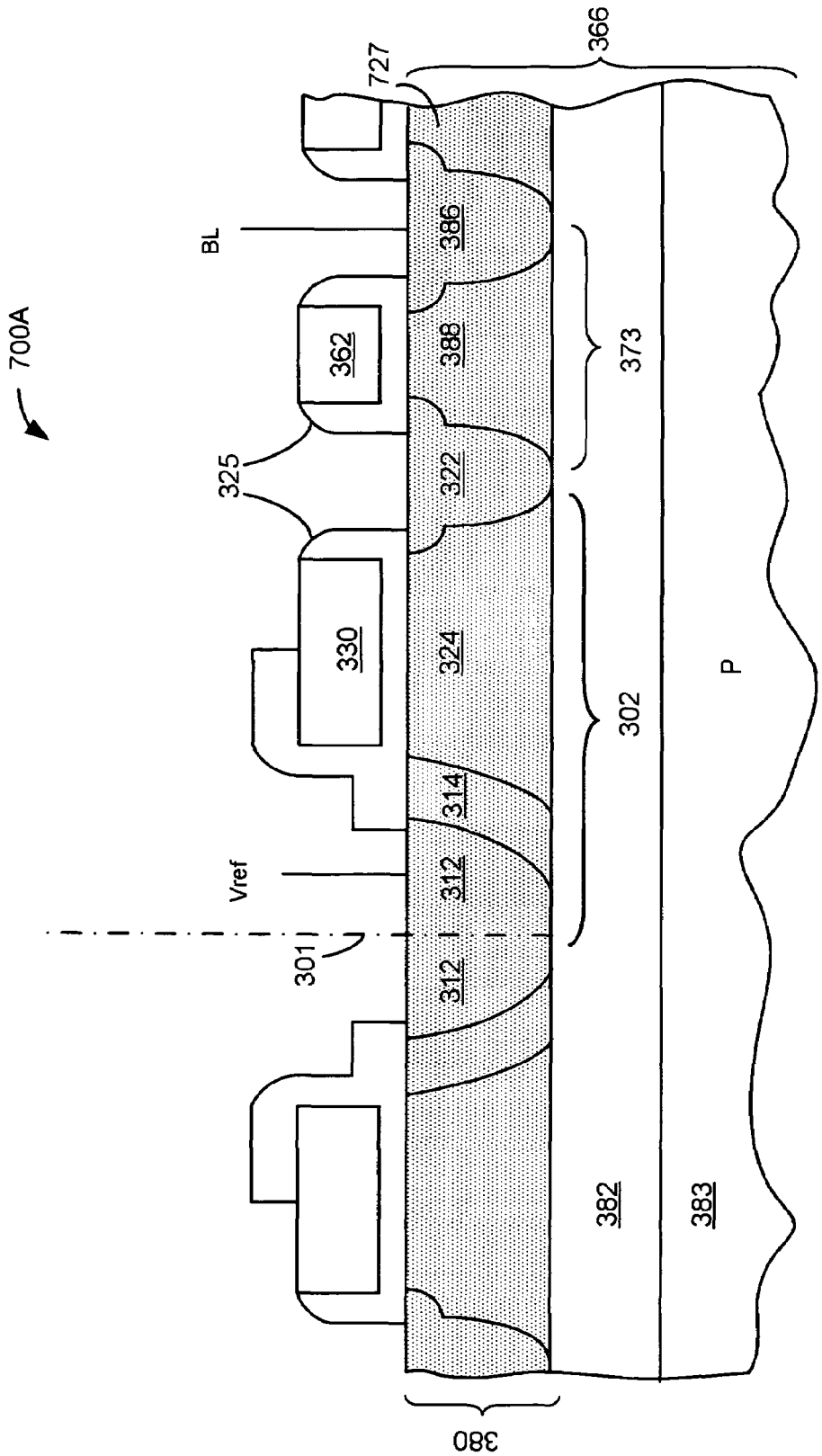
FIG. 7A is a simplified cross-sectional view of a thyristor-based memory showing an access device and a capacitively coupled thyristor with essentially all portions doped with a high ionization energy acceptor (area shaded), according to another embodiment of the present invention.

Referencing FIG. 7A, in accordance with further embodiments, indium may be implanted throughout all regions of thyristor 302 and access transistor 373 of a thyristor-based memory device 700A. The indium, in this embodiment, may be implanted with concentration to affect primarily p-dopant regions 312, 324, and 388. Even though other portions of the device (e.g., n-dopant regions) may also receive indium, the gain adjusting benefits with respect to temperature of the indium may remain available to the constituent bipolar devices of the thyristor 302.

Figure 7B:
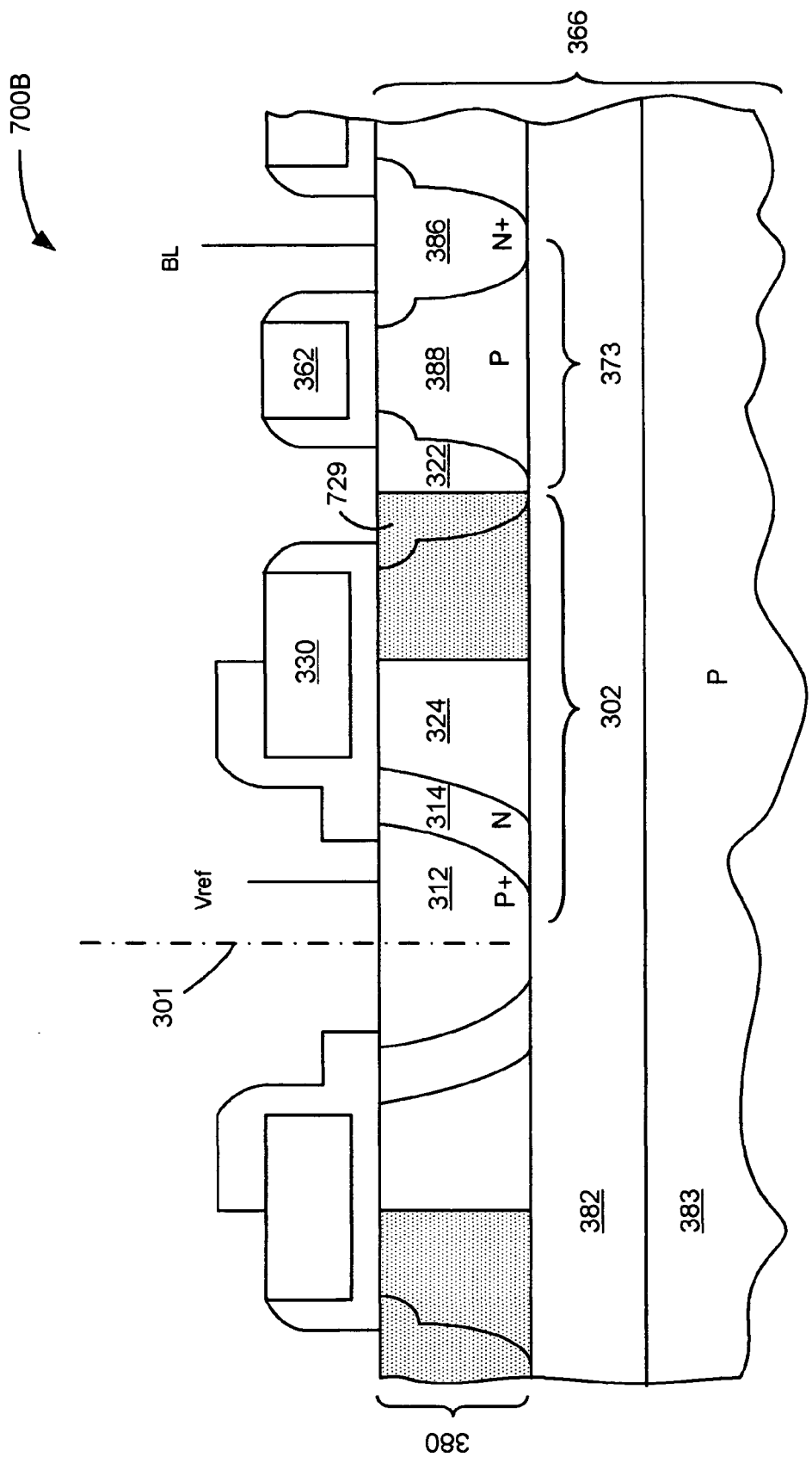
FIG. 7B is a simplified cross-sectional view of a thyristor-based memory showing at least portions of a p-base and a cathode-emitter doped with a high ionization energy acceptor (area shaded), according to another embodiment of the present invention.

In a further embodiment, referencing FIG. 7B, the indium-doped region 729 may comprise a region laterally extending from a mid-region of p-base 324 to a mid-region of cathode-emitter 322. In this embodiment, the indium may primarily affect properties of p-base 324, perhaps and including its junction as defined relative to cathode-emitter 322.

Figure 7C:
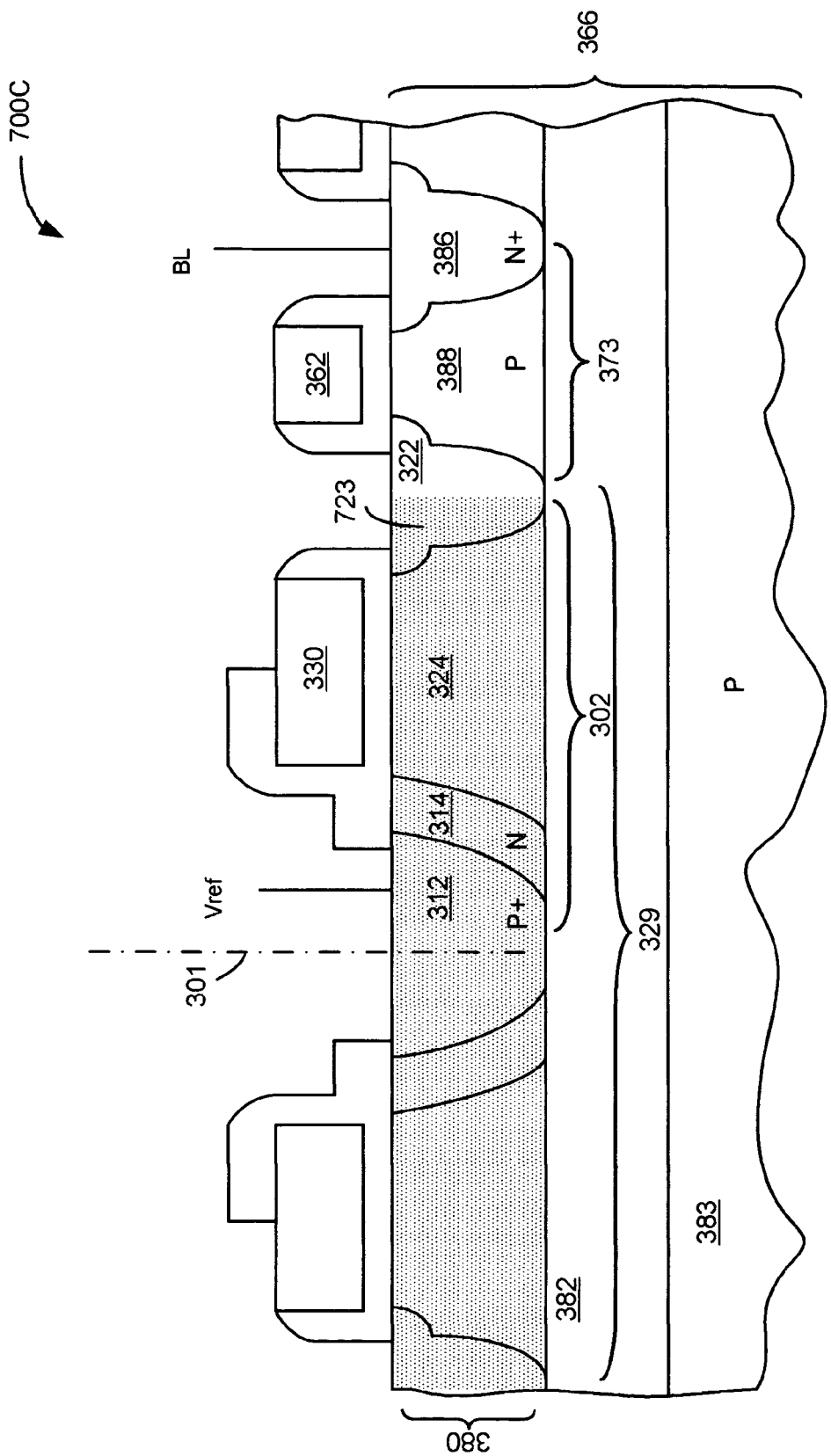
FIG. 7C is a simplified cross-sectional view of a thyristor-based memory showing two mirror-image capacitively-coupled thyristors that may be doped with a high ionization energy acceptor (area shaded), according to another embodiment of the present invention.

Referencing FIG. 7C, in yet another embodiment, the indium-implanted region 723 may extend through the majority of regions of thyristor 302 (as represented schematically by the shaded area). For example, the indium-implanted region may extend from about the middle of cathode-emitter 322 to and through anode-emitter 312.

In the event that another mirror-image thyristor-based memory cell may be formed about a mirror axis 301, the indium-implanted region 329 may extend from the cathode-emitter of one thyristor device, there through and to the cathode-emitter of the neighboring mirrored thyristor. In such embodiment, of such indium distribution, the indium may affect primarily operation of the p-doped regions such as the more lightly doped p-base regions 324.

In other embodiments, the depth or width of the portion with indium, as a high ionization energy acceptor, may depend on parameters of the ion implantation process. For example, high implantation energy could result in an implantation depth greater than a low implantation energy. In a particular embodiment, the indium implant region may be defined primarily within p-base region 324 extending laterally between n-base 314 and cathode-emitter 322.

In another particular embodiment, the indium-implanted portion of p-base region 324 may extend to a periphery defining an outline laterally shy of the depletion zone between the p-base and cathode-emitter regions 322 and 324. In a further embodiment, the portion receiving the indium implants may comprise primarily an upper surface region of p-base 324 beneath and relative to electrode 330. Alternatively, in other particular embodiments, the indium-implanted region may again be formed in primarily the top surface region of p-base 324 and may extend to varying depths within this region of the silicon layer 380 of the substrate 366.

In particular embodiments, the maximum or peak indium concentration in silicon may vary from a light level of approximately $1 \times 10^{16}/cm^3$ to a higher level such as $1 \times 10^{19}/cm^3$. In further embodiments, the indium (or other high ionization energy acceptor) could be implanted with dosage and implant energy based on a thickness of p-base 324. In one embodiment, the dosage to form the indium implant may vary from a light doping range of about $1 \times 10^{11}$ cm$^{-2}$ to about $1 \times 10^{14}$ cm$^{-2}$.

As suggested above, in most embodiments, p-base region 324 may generally comprise other typical p-type dopants therefor, such as boron. Depending on the particular embodiment, the boron dopant implant may overlap to varying degrees the portion of p-base implanted with the temperature compensating dopant of indium (or other high ionization energy acceptor).

Concerning the substrate, further referencing FIGS. 7A and 7B, substrate 366 may comprise a silicon-on-insulator (SOI) structure having a layer of silicon 380 (e.g., silicon which may be supplied or previously doped with boron), over an insulator/dielectric 382 (e.g., oxide) supported by supporting substrate 383. In particular embodiments, supporting substrate 383 may receive a bias operable to influence characteristics of p-base region 324. Such variable bias may further control, based on temperature, the bipolar gain of a constituent bipolar transistor 314, 324, 322 of the thyristor 302. Such temperature controlled bias adjustment may be described in greater detail in U.S. patent application Ser. No. 10/741,538 of Nemati et al, which is owned by the assignee of the present invention, and incorporated herein by reference. Such temperature-dependent bias means may be calibrated to individually accommodate variations in the resultant concentration of indium (or other high ionization energy acceptor) in p-base region 324.

Turning back with reference to FIG. 4B, the compensating effects of the indium implant (or other high ionization energy acceptor) associated with some embodiments of the present invention may be interpreted as having the effect of increasing the number of options available for the design of the thyristor memory device. Relative to a design template, e.g., template 400B of FIG. 4B, the indium implant may be described as having the effect of widening a design window 402 associated with selecting a target gain for a constituent bipolar transistor of the thyristor. The widened design window may span a range of operable gains deemed permissible available for the design of the thyristor device. Per embodiments of the present invention, the additional extent to the available design options may be more readily apparent by comparing such exemplary design template (400B of FIG. 4B) relative to the more limited window available that could otherwise be presented about target gain $\beta_T$ of the more customary devices, e.g., as previously described relative to FIG. 4A. The design window 402, as revealed by template 400B of FIG. 4B, may be understood to ease the design of thyristor-based memory devices. For embodiments of the present invention that may establish gain selection opportunities such as represented, e.g., by template 400B. Such embodiments might also be understood to ease process controls as might otherwise be required during fabrication of thyristor-based semiconductor memory.

For such embodiments, further referencing the first-type failure curve 404B of design template 400B (FIG. 4B), the indium (or other high ionization energy acceptor) doping may be described as having the effect of expanding the range of acceptable gain (β) values that may be selected for design of the bipolar devices within the thyristor. The expanded range can be seen to also assist more reliable operability of associated thyristor-based memory devices at low operating temperature (of 0° C.). In comparison to an exemplified corresponding failure curve 404A for a typical device (referencing FIG. 4A) embodiments of the present invention may be viewed as providing an apparent leftward shift to the failure curve for the low temperature (at 0C). This apparent leftward shift of failure curve for that represented by 404B may also be understood to expand acceptable processing tolerances during fabrication, which may also enable greater product yield—i.e., production with lower defect probabilities for a given selection of bipolar gain. The magnitude of the leftward shift as schematically represented by failure curve 400B (relative to the exemplified typical design template) may be thought of as being influenced by various factors such as the concentration and distribution of indium (or other high ionization energy acceptor) within the p-base region.

During operation of the thyristor-based memory under high temperature conditions, the indium (or other high ionization energy acceptor) implants may alternatively be viewed as serving to decrease the bipolar gain of the thyristor with increasing temperature and thus increase the effective forward blocking voltage of the thyristor. At the higher temperatures, it may be theorized that a higher percentage of the implanted indium (or other high ionization energy acceptor) atoms may ionize, thereby lowering the bipolar gain and increasing the effective forward blocking voltage of the thyristor by magnitude dependent on temperature increase. This may be viewed as equivalent to shifting the second-type failure characteristic curve 406 (e.g., relative an exemplified typical device at 125° C.) of the design template rightward.

Figure 8:
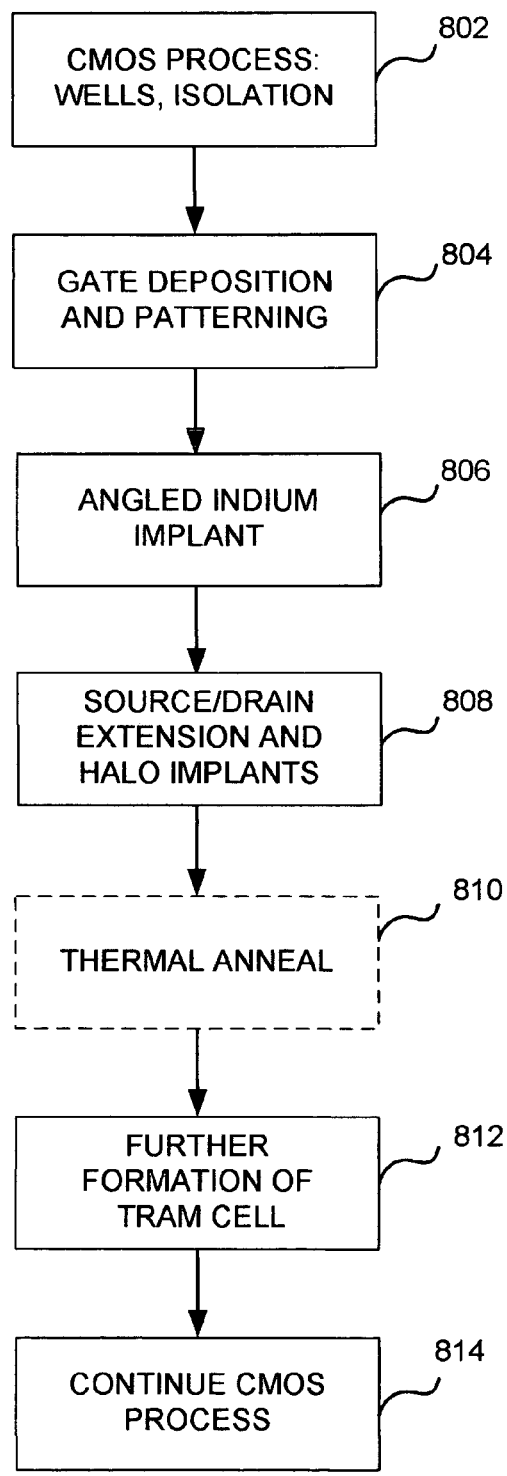
FIG. 8 is a simplified process flow diagram illustrating a method of forming a thyristor-based memory according to an embodiment of the present invention, including an implant with a dopant of a high ionization energy characteristic.

To produce thyristor-based memory devices, moving forward with reference to FIG. 8, a method 800 of fabrication may initially comprise definition of active regions. For example, a (bulk) semiconductor substrate may initially comprise a P-type semiconductor material. Given active regions may be defined therein by implanting N-type dopant to form an N-regions within the semiconductor material. Additionally, isolation trenches might also be formed between different active region(s). Such procedures may be understood to be represented within block 802 (e.g., the CMOS process for the formation of wells, isolation, and the like) of the simplified flow chart of FIG. 8. Further, it may be understood that the procedures of block 802 might also be representative of initial CMOS processes for an SOI substrate (e.g., substrate 366 of FIGS. 5A and 5B).

Figure 9A:
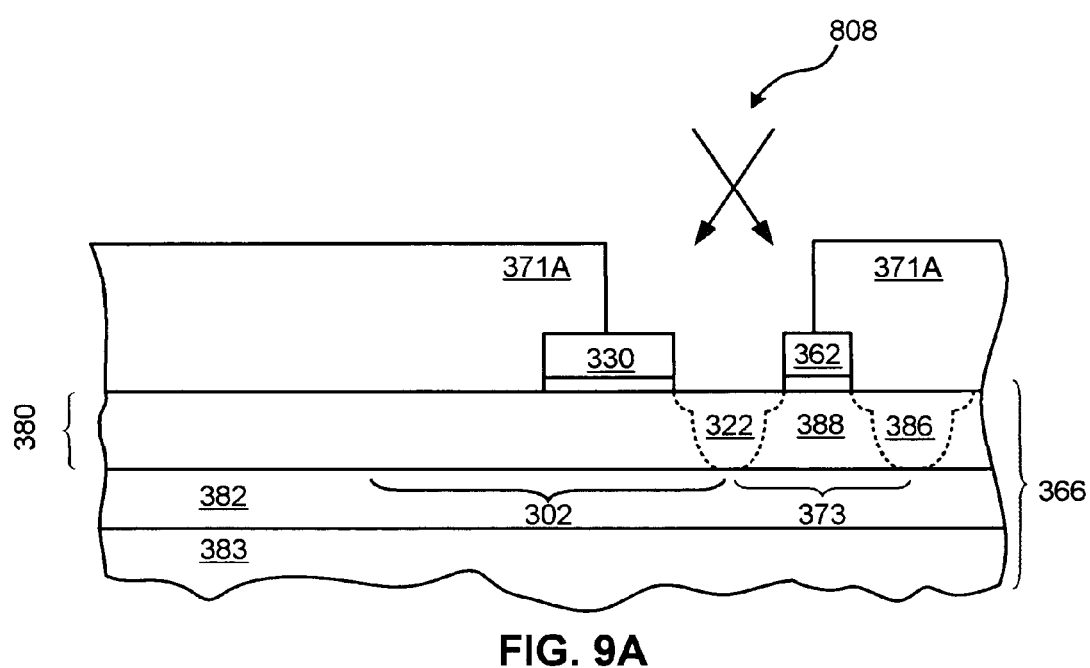
FIG. 9A is a simplified cross-sectional view showing a stage of memory fabrication and showing angular implant with a dopant of high ionization energy characteristic.
Figure 9B:
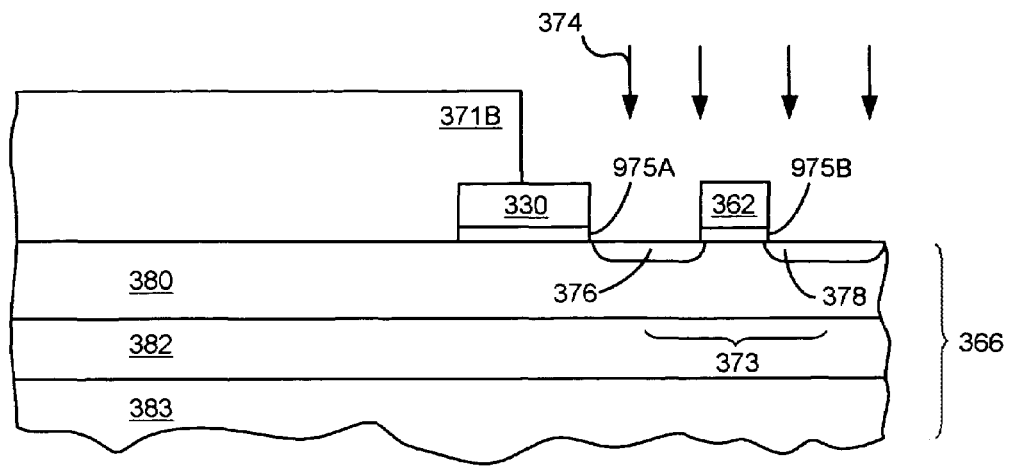
FIG. 9B is a simplified cross-sectional view showing a given stage of fabrication for a memory device according to a method of FIG. 8, which may include the formation of drain/source extensions.
Figure 9C:
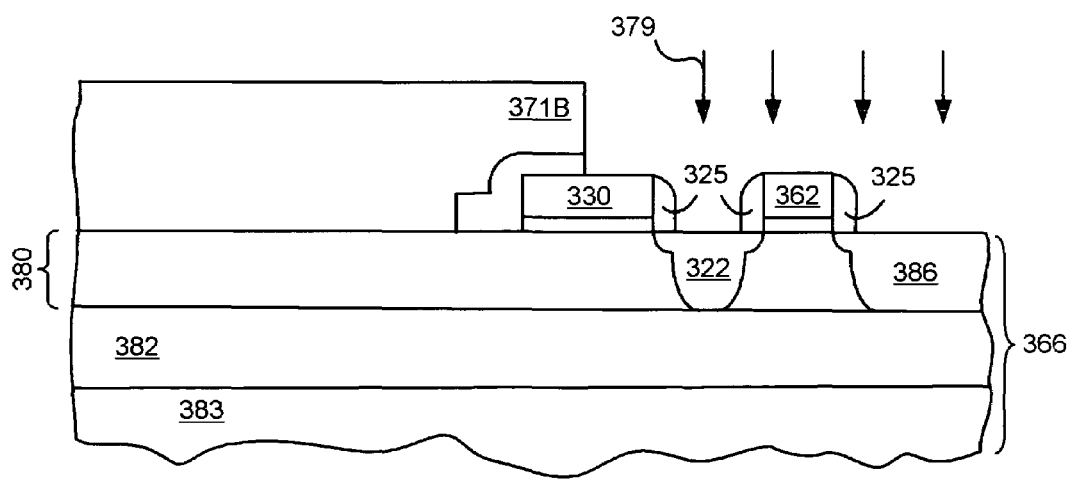
FIG. 9C is a simplified cross-sectional view showing a further stage of the memory fabrication of FIG. 9A, and showing the deep implants for source/drain regions.

Further referencing the simplified flow chart of FIG. 8 in combination with simplified sequential drawings of FIGS. 9A–9C, dielectric 975A, 975B may be formed over a layer of silicon 380 of SOI substrate 366, which might also be incorporated as part of the preliminary "CMOS Process" (block 802, FIG. 8). In a particular embodiment, dielectric 975A, 975B may be formed as a thermal oxide; further, it may be described as a gate oxide or gate dielectric. Conductive polysilicon may be deposited and patterned 804 over the gate dielectric to define electrodes 330, 362. One electrode 362 may serve as the gate for an access transistor MOSFET 373 and the other electrode 330 may serve as a capacitor electrode to be capacitively-coupled to a base-region for the thyristor 302.

The electrode 362 for the MOSFET gate may be formed over the gate oxide 975B and in insulated relationship over body region 388. The electrode 330 for the capacitively-coupled thyristor may be formed in insulated relationship over a base region to be defined for the thyristor. The capacitor electrode may be described as capacitively-coupled thereto via dielectric 975A (e.g., via a thermal or gate oxide or other insulator). In one example, dielectric 975A associated with capacitor-electrode 330 may be formed with a thickness of between 2 nm and 30 nm; more typically about 5 nanometers. In another example, gate dielectric 975A associated with the gate for the access transistor 373 may be formed with a thickness of between 2 nm and 30 nm; more typically about 2 nanometers. Polycrystalline silicon for the electrodes, in one embodiment, may be formed with a thickness of between about 80 nm and 1000 nm, and typically around 200 nanometers.

Further referencing FIG. 9A, mask material (photoresist) 371A may be deposited and patterned to mask and protect portions of the substrate that are to be associated with the thyristor (and also the bitline contact or source/drain region for this embodiment). Additional masking may be provided, before formation of sidewalls 325 (discussed below), by capacitor-electrode 330 and transistor gate 362. The exposed regions as defined by mask 371A, electrode 330, and gate 362, may define desired locations to assist implanting of indium. In one example, mask 371A may be formed from photoresist with a thickness greater than 1000 angstroms, such as a thickness of about 2500 Å. The mask may define a window to expose at least a portion as may be associated with the cathode-emitter 322. The window may be defined in part by a peripheral edge of capacitor electrode 330 that is to be capacitively-coupled to the p-base for the thyristor.

The implant of the indium or other high ionization energy acceptor (block 806, FIG. 8) may be performed, in one embodiment, using an angled implant trajectory. The angled implant may drive the dopant through cathode-emitter 322 and into the neighboring portion for the p-base region. The extent of the implanted region may be defined by the angle of implant, energy of implant, and the lateral placement of electrode 330 and/or accompanying sidewall spacer 325. The implant may also be understood to overlap a depletion zone associated with the pn junction defined between the region for the p-base and the cathode-emitter 322. After the indium (or other high ionization energy acceptor) implantation 806, the mask 371A may be removed.

The CMOS processes may then be performed (block 808 of FIG. 8) to define, e.g., at least parts of access transistor 373. Referencing FIG. 9B, photoresist or mask 371A may be removed and a new mask 371B formed to protect regions of the semiconductor to be associated with the thyristor device and to expose others desired for locations of CMOS devices. The n-type extension regions 376, 378 (e.g., for lightly doped drain or LDD regions) may be formed about gate electrode 362 by an implant 374 of n-type dopant. In one embodiment, the implants 374 for the extension regions may be formed using phosphorous with an implant dosage of about $8 \times 10^{14}$ per cm$^2$. Additionally, it may be understood that these extensions may be formed before development of spacers (325, FIG. 9B) against the sidewalls of electrodes 330, 362.

Halo implants might also be implanted to location(s) between or proximate the extension regions 376, 378 and the body region. In a particular embodiment, the halo implants may be formed with, e.g., boron implanted with predetermined implant angle.

Although particular magnitudes may be described for the doping levels, material thickness, extents and dimensions for given embodiments; it will be understood that these magnitudes may be merely exemplary and that alternative magnitudes may be available therefor—e.g., alternative embodiments may employ parameters for the oxide thickness, silicon thickness, implant species, concentrations or densities as may be desired for alternative specifications. For example, in some embodiments, substrate 366 may comprise an SOI substrate with a silicon layer of about 1000 angstroms, and the N-type extension regions may be formed from a species of arsenic implanted with, e.g., a 0 degree angle (i.e., ion beam perpendicular to the silicon surface). However, should a specified operating voltage be able to increase and power budget shift, alternative embodiments might allow for increased (alternative) design magnitude(s).

In yet other embodiments, the indium implant may be performed after the extension and/or halo implants, but before the formation of spacers and deep-level source/drain implants.

After the extension and halo implants 806, a dielectric such as nitride may be formed conformal to and over the substrate and electrodes. An anisotropic etch may be used to etch the dielectric and form sidewall spacers 325 against sidewalls of the electrodes. In some embodiments, sidewall spacers may be formed while masking regions of the substrate for the thyristor; while, in other embodiments, the formation of sidewall spacers may be deferred, perhaps until further CMOS processing 814 (infra. herein below).

After forming the spacers 325, further referencing FIG. 9C, N-type species 379 may be implanted with high energy to form the deep level (e.g. N+) source and drain regions 322, 386 about gate electrode 362. These regions may be formed self-aligned relative to peripheral edges of spacers 325. In a particular embodiment, these deep implants may use species such as arsenic with an energy and dosage to penetrate a full depth of the layer of silicon 380 of SOI substrate 366, e.g., energy of about 40 keV and dosage of about $2 \times 10^{15}$ cm$^{-2}$.

Further referencing FIGS. 8 and 9A, the indium (or other high ionization energy acceptor) may be implanted into at least a portion of p-base region 324.

In the cases described with reference to FIGS. 9A–9C, cathode-emitter 322 may comprise a heavily doped N+ region and the p-base 324 a lightly doped P− region. Accordingly, most of the depletion zone may be described as residing within the location for p-base 324. Indium (or other high ionization energy acceptor) may be further theorized to ionize more fully within the depletion zone, which might also reduce certain punch-through or breakdown hazards thereof.

A wide variety of implant doses, energies, and implant angles might be used for various embodiments. The implantation energy selected to drive the indium (or other high ionization energy acceptor) atoms through the cathode-emitter region 322 could vary according to the depth and width for the p-base region and, possibly, that of cathode-emitter region 322.

Another factor may also include whether or not a substrate back-bias (support substrate 383 of SOI 366) may be expected to be available to assist control of the hole concentration in p-base region 324. Control bias might also be understood to be available to capacitor-electrode 330 as well as support substrate 383 (e.g., as in the case in which substrate 383 is electrically coupled to a control voltage), as may be used to further stabilize with respect to temperature. Another possible factor may be the degree to which the p-base region 324 may be doped with boron in combination with indium (or other high ionization energy acceptor). Yet another possible factor may be the capacitance between electrode 330 and p-base region 324.

In a particular example, assuming a silicon layer of thickness 1000 angstroms, an indium dose of about $6 \times 10^{12}$ cm$^{-2}$ and an implantation energy of about 100 keV may be used to form a peak indium concentration in the silicon of about $1 \times 10^{18}$ cm$^{-3}$. Again, the resulting concentration may depend on a variety of the device and process conditions, including, e.g., oxidation and other thermal processing conditions.

Further referencing FIG. 8, an optional thermal anneal 810 may follow the indium (or other high ionization energy acceptor) implant 808. The thermal anneal may recrystalize the silicon and remove damage in the crystal structure as may have been caused by implantation.

One method may employ low-temperature solid phase crystallization (SPC). Low temperature SPC may provide low cost anneal to offer the results of large grain size, and uniform crystallization with minimal defects. Generally, it may use low furnace temperature (e.g., 500° C.) with a long anneal duration—possibly 170 hours. Another type of SPC is Rapid Thermal Annealing (RTA), which may use a higher temperature (e.g., 700° C.), for faster and greater throughput, while typically producing results of smaller grain size. Further referencing FIG. 8, further formation 812 of the thyristor 812 to the thyristor-based memory may be performed, along with other CMOS processing 514 (e.g., dopant implants, masking, sidewall formation if not previously performed, metal deposition and patterning, passivation and pad masking, salicide formation) may then be performed to complete remaining integration of the thyristor-based memory device.

Figure 10:
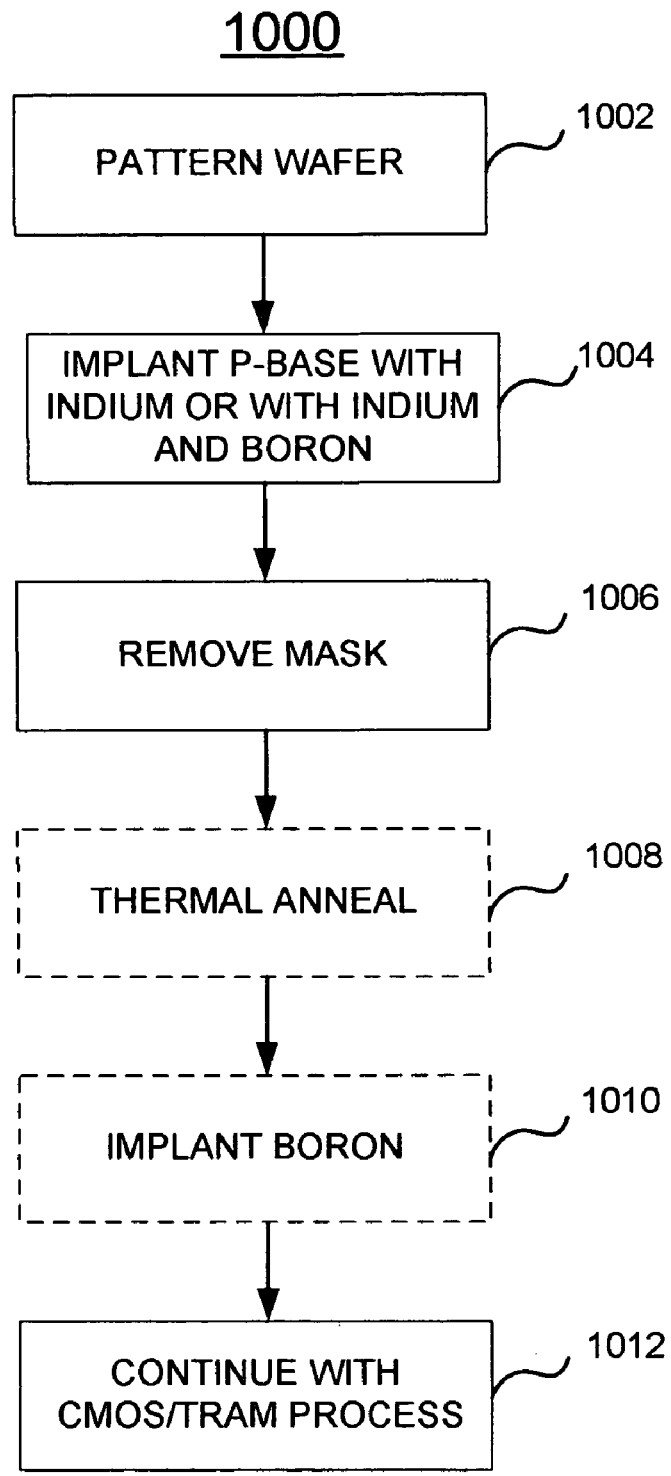
FIG. 10 is a simplified process flow diagram for a method of forming a thyristor-based memory device in accordance with another embodiment for implanting indium or another high ionization energy type acceptor dopant.

In accordance with other embodiments of the present invention, referencing the simplified flow chart of FIG. 10 and the simplified sequence of FIGS. 11A–11D, initial CMOS processing may be performed to form wells and isolation or SOI substrate preparation similarly as described earlier relative to FIG. 8. A mask may be patterned (block 1002 of FIG. 10) to define a window to expose at least a portion for a region to be associated with p-base region 324. Indium (or other high ionization energy acceptor) implant (block 1004) may then be performed. This method 1000, thus, implants the indium before the formation of electrodes, gate oxide, etc. Further, it may be noted, further referencing FIG. 11A, that various regions for the definition of thyristor and access transistor to the TRAM may be shown schematically with dashed lines within the layer 380 of silicon of SOI substrate 366 so as to represent where the regions are expected to be formed. Accordingly, these phantom line boundaries may be illustrated merely for purposes of assisting description of implant for the indium (or other high ionization energy acceptor) relative to the desired base region for the thyristor.

Figure 11A:
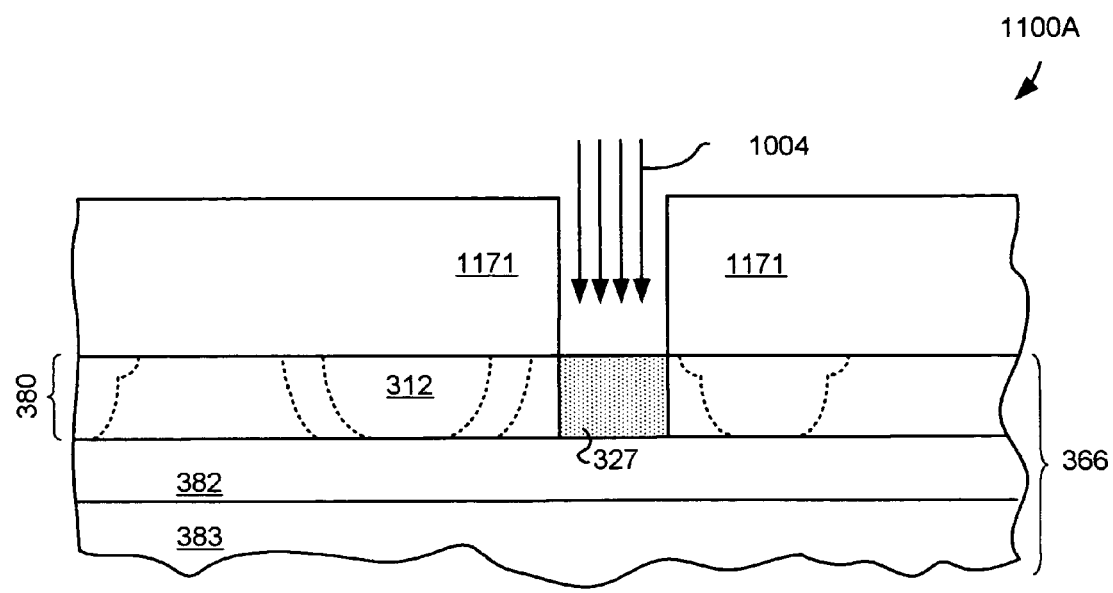
FIG. 11A is a simplified cross-sectional view of a substrate during a stage of fabrication for a thyristor-based semiconductor memory device, showing implant dopant of a high ionization energy characteristic into a region to be associated with a p-base for the thyristor.

Continuing with further reference to FIG. 11A, the indium (or indium and boron) may be implanted 1004 into the exposed regions of silicon layer as defined by the window of the mask 1171.

In a particular embodiment, the layer of silicon of the SOI substrate may have a thickness (measured perpendicular to the surface of substrate 366) of about 1,000 Å. The dose of indium atoms during implant may be about $3.0 \times 10^{12}$ cm$^{-2}$, with an implantation energy of about 100 keV, and using an implantation angle of at least 83 degrees as measured from the plane defined by the surface of substrate 366 (i.e., within about 7 degrees from vertical thereto).

In a further embodiment, boron may also be implanted using the same mask (block 1104), and might also be implanted in conjunction with the indium (or other high ionization energy acceptor).

Further referencing FIGS. 10–11A, once the indium (or indium and boron) implant has been completed, the photoresist mask 371 may be removed (block 1106). A thermal anneal may optionally be performed (block 1108), to remove implant damage and recrystalize the silicon. Although a variety of thermal anneals may be used, in a particular embodiment, the thermal anneal may comprise heat exposure of at about 650° C. for about 30 minutes.

In a further embodiment, the boron implant (1010) may be performed after the anneal, e.g., 1008, using a dose of $1.5 \times 10^{12}$ cm$^{-2}$, and implantation energy of 15 keV. In another embodiment, a lower energy may be used to implant the boron atoms into shallow surface depth of the silicon associated with the region for p-base 324. This may have the benefit of placing the highest concentration of boron ions in close proximity to a capacitor electrode 330 to be formed thereover, wherein they would be capable of being influenced more strongly by the capacitively-coupled capacitor electrode.

Figure 11B:
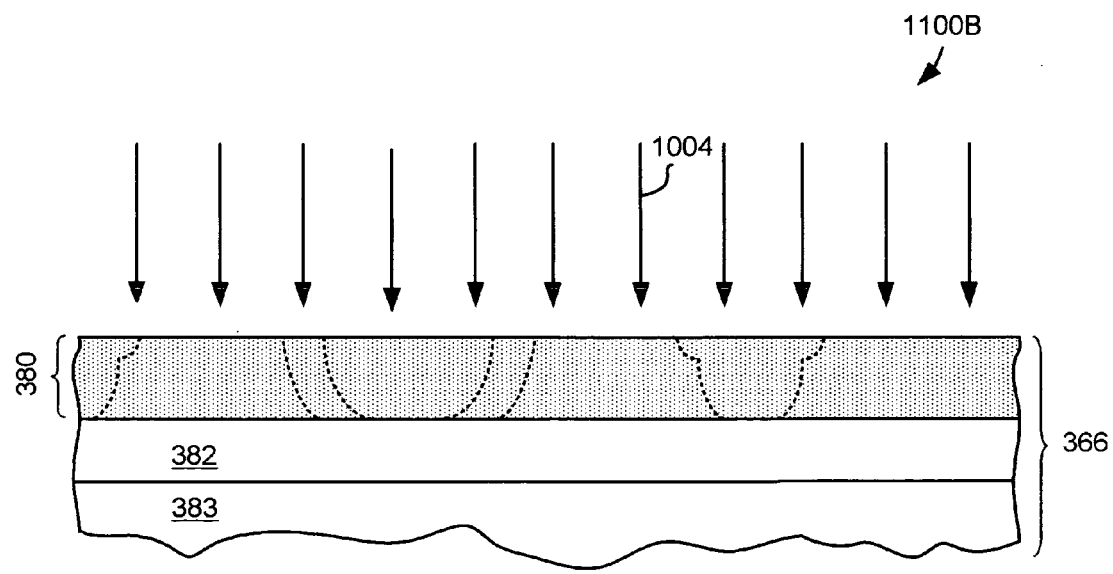
FIG. 11B is a simplified cross-sectional view of a substrate during a stage of fabrication for a thyristor-based semiconductor memory device in accordance with another embodiment of the present invention, showing implant of dopant having high ionization energy characteristic to be distributed across multiple regions for the thyristor and multiple regions for an access transistor.

Referencing FIG. 11B, in another embodiment, the indium implant (block 1004) may be performed across both regions to be used for the thyristor and access transistor. This alternative indium distribution may be used to produce devices similar to those described previously with reference to FIG. 7A.

Figure 11C:
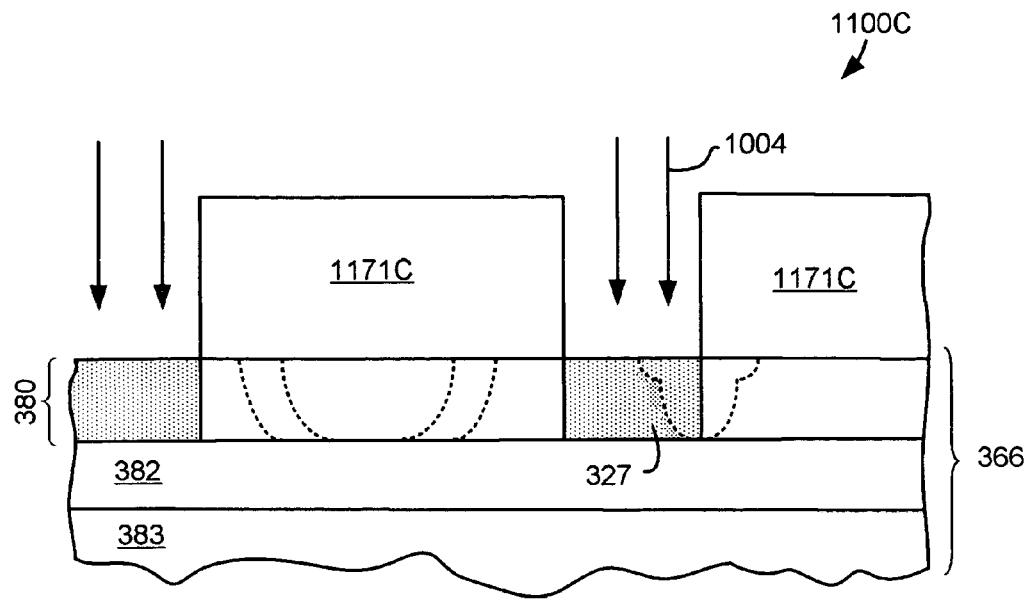
FIG. 11C is a simplified cross-sectional view of a substrate during a stage of fabrication for a thyristor-based semiconductor memory device in accordance with an embodiment of the present invention, showing implanting of dopant having a high ionization energy characteristic for placement across a region that will be associated with a portion of the thyristor's base region and neighboring cathode-emitter region.

In yet another embodiment, referencing FIG. 11C, the window defined by a mask 1171C may extend laterally from the middle region for a p-base to the middle of a region for a cathode-emitter for the thyristor device to be formed in the silicon layer 380. The indium doping may further penetrate an entire thickness of the exposed regions 327 of silicon as defined by the mask 1171C. This particular method could be used to produce the devices with indium-doped regions similar to those described previously with reference to FIG. 7B.

Figure 11D:
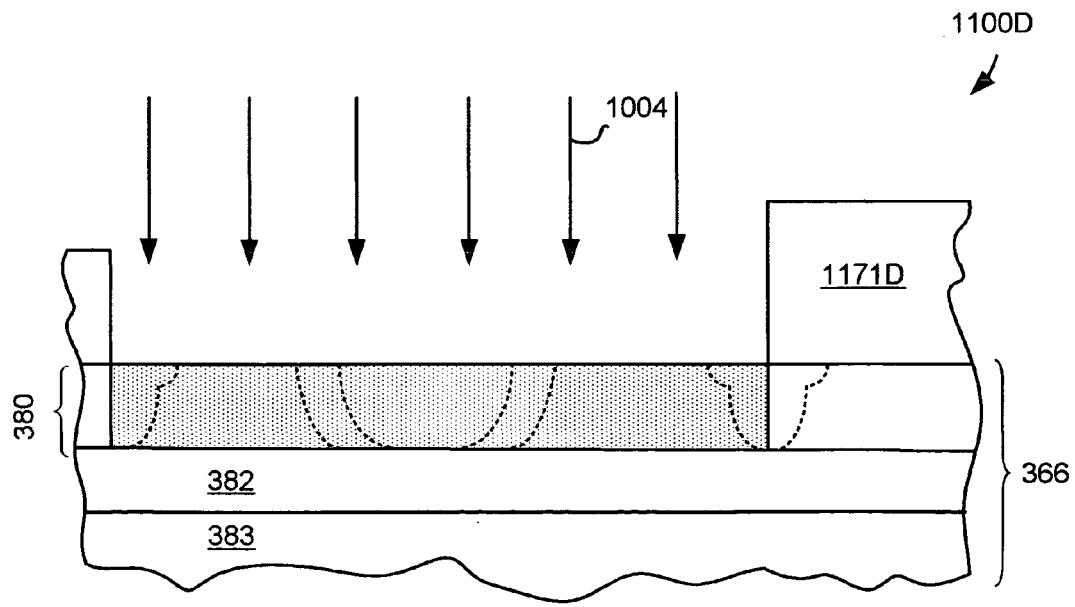
FIG. 11D is a simplified cross-sectional view of a substrate during a stage of fabrication for a thyristor-based semiconductor memory device in accordance with another embodiment of the present invention, showing implant of dopant having a high ionization energy characteristic across regions of the semiconductor material to be associated with thyristor devices, which may include two mirror-imaged thyristors.

Referencing FIG. 11D, in another method of processing a portion of silicon 380 to be associated with the formation of an access transistor, a thyristor and mirror images therefore about a mirror-image axis may be defined by an opening of mask 1171D. The opening may extend laterally from near the middle of the region desired for the cathode-emitter of one thyristor to near the middle of the region desired for the cathode-emitter of the neighboring mirror-image thyristor. In other words, all regions of the silicon layer to be associated with the neighboring mirror-image thyristors, such regions may be left exposed as defined by the patterning of mask 1171D. These exposed regions may then receive indium via an indium implant 1004. Such method may be used for the formation of thyristor-based memory similar to those described previously with reference to FIG. 7C.

In accordance with another embodiment, the indium (or other high ionization energy acceptor) may be implanted or formed in a region of/for an alternative thyristor-based memory device that may be described as having vertically aligned/oriented regions, e.g., of a fin structure.

Figure 12A:
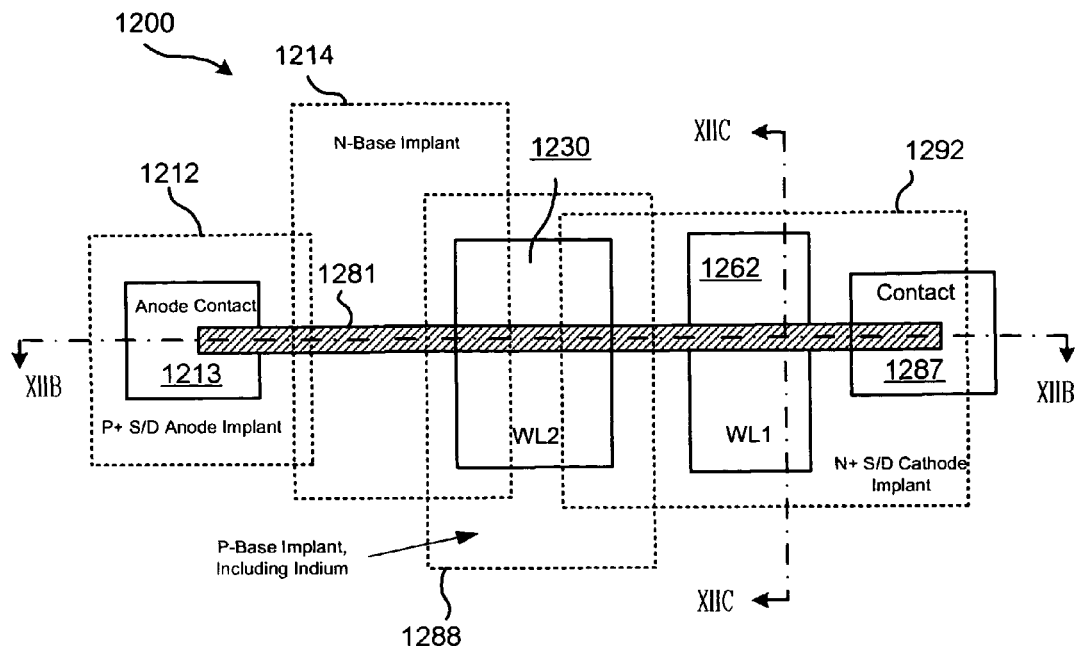
FIG. 12A is a planar view showing the implant regions or apertures, including an indium implanted p-base region, of a thin capacitively-coupled thyristor of a fin realization as may be associated with certain embodiments of the present invention.
Figure 12B:
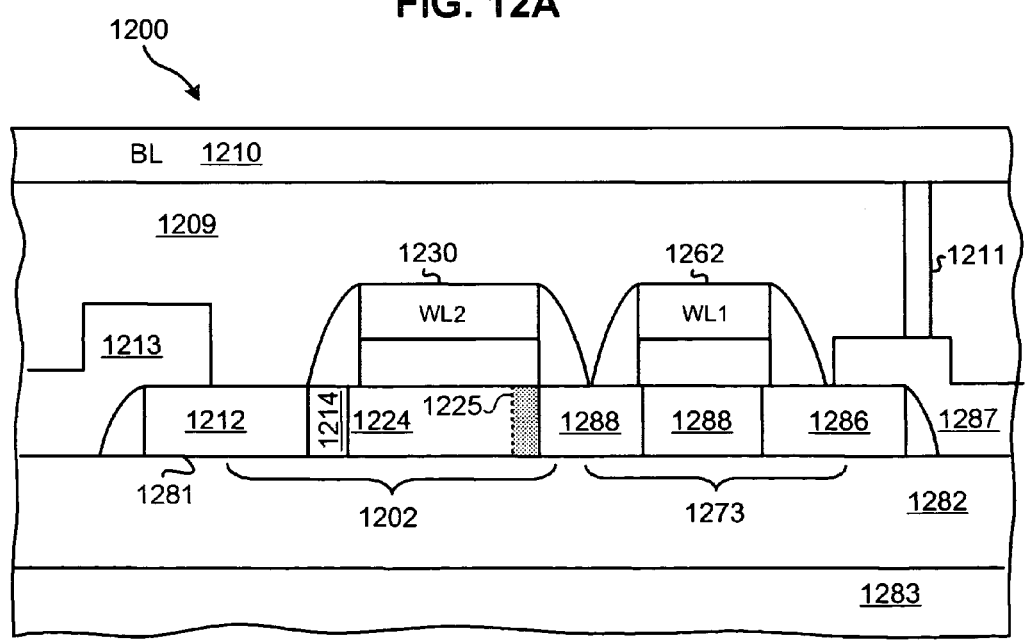
FIGS. 12B and 12C provide simplified cross-sectional views of the thyristor-based memory device of FIG. 12A according to an embodiment of the present invention.
Figure 12C:
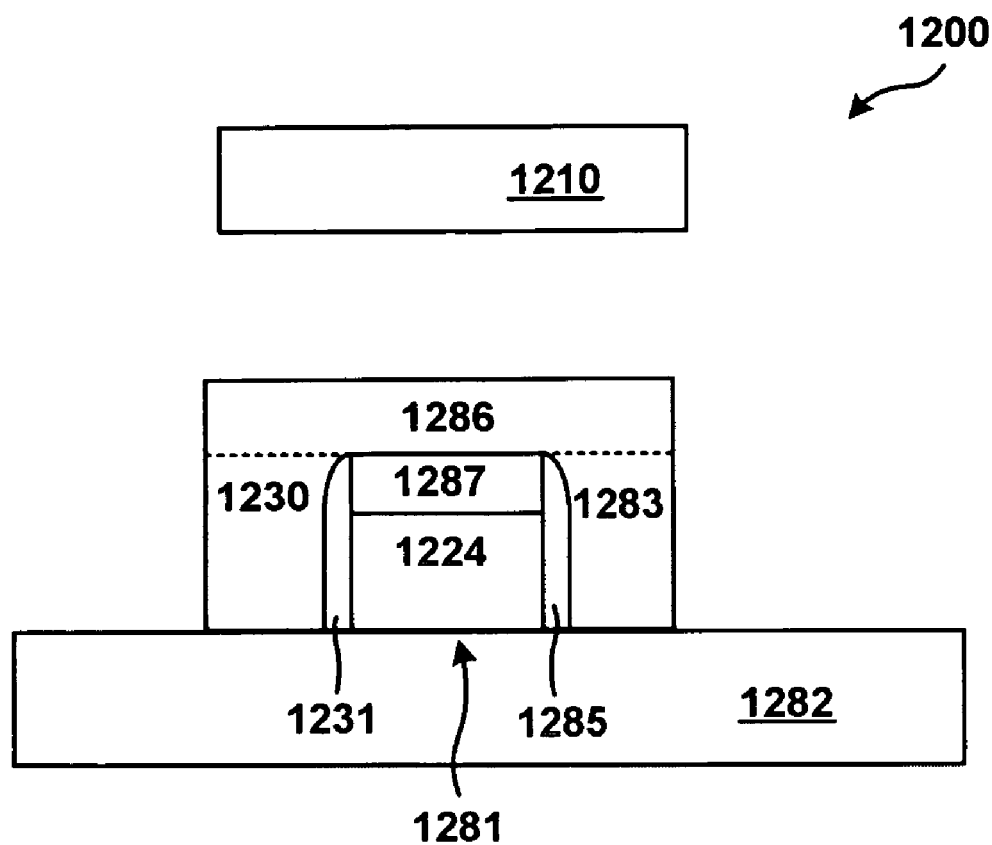

Referencing FIGS. 12A–12C, a thyristor-based memory 1200 may comprise indium (or other high ionization energy acceptor) implanted into a p-base region within an embodiment for a fin structured thyristor-based memory device. For such embodiment, the thyristor and access transistor may be formed in a ridge or fin of silicon 1281. In one example, fin 1281 may be formed over insulator 1282 (e.g., or oxide) supported by supporting substrate 1293 (FIG. 12B).

Further referencing FIGS. 12A–12C, portions of silicon fin 1281 may be implanted (via different dopants and respective implant apertures 1212, 1214, 1288, 1292) to form respective regions of thyristor 1202 and access transistor 1273. Referencing the longitudinal cross-section of FIG. 12B, thyristor 1202 may comprise anode-emitter 1212, n-base 1214, p-base 1224 and cathode-emitter 1222. The access transistor 1273 may comprise source and drain regions 1286, 1222 about body region 1288. Anode-emitter 1212 of thyristor 1202 may be coupled to conductive material 1213 to receive anode voltage signal (Vref) via an operable contact via and/or metallization (not shown). Source/drain 1286 of access transistor 1273 may be electrically coupled to bitline 1210 by way of overlapping conductive material for contact 1287 and via 1211. Known interlayer dielectric 1209 (e.g., BPSG, Spin-on-glass, aromatic hydrocarbons, etc.) may support conductive lines such as bitline 1210 over the thyristor memory device 1200. Additional information for the structure and fabrication of the fin-type thyristor memory may be found in U.S. application Ser. No. 10/238,572, hereby incorporated by reference in its entirety.

Referencing FIG. 12A, apertures or implant regions may comprise a P+ source/drain anode aperture 1212, an n-base aperture 1214, a p-base aperture 1288, and an N+ source/drain cathode aperture 1292. P-type implant of p-base aperture 1214 may be used in either one or two separate implant applications. A first may comprise implanting an entire base region with the normal p-type dopants and a second implant may comprise second implant angled into the p-base region while using the wordline 1230 formed thereover as a mask element in combination with other p-base masking provisions as describe previously herein for embodiments associated with other indium (or other high ionization energy acceptor) implants. Accordingly, the angled indium (or other high ionization energy acceptor) implant may form a region of indium (or other high ionization energy acceptor) 1225 proximate (and/or overlapping in some embodiments) the junction between p-base 1224 and neighboring cathode-emitter 1222.

In an alternative embodiment, the indium (or other high ionization energy acceptor) may be implanted as an additional dopant into the p-base region using the same aperture and masks as may have been used during the normal p-base dopant (e.g., boron) implant for formation of the overall p-base region. For this embodiment, the indium implant may use an energy sufficiently light so as to keep the indium (or other high ionization energy acceptor) distribution as substantially within a surface region of the p-base region 1224 to be disposed beneath second wordline 1230 that will be formed thereover in subsequent steps. The particulars for implanting the indium (or other high ionization energy acceptor) may be performed similarly as described previously for methods 800 and 1000, as well as other methods discussed relative to FIGS. 5A–11C.

Referencing FIG. 12B, base region 1224 (e.g., p-base) of thyristor 1202 may comprise a thickness that may correspond to the cross-sectional dimensions of the fin. In some examples, fin 1281 may comprise a height greater than that of its cross-sectional width between the sidewall electrodes 1230. For example, fin 1281 may comprise a height greater than 1,800 Å and a width less than 1,500 Å. In a further example, it may comprise a height greater than 1,800 Å and a width of about 1,000 Å.

Further referencing FIG. 12C, thin dielectrics 1231, 1285 may insulate electrodes 1230, 1283 respectively about opposite sidewalls of base region 1224. The dielectrics 1231, 1285 may define per their thickness and dielectric constant the capacitive couplings of respective electrodes 1230 and 1283 to base region 1224.

In one embodiment, the electrodes 1230, 1283 may be electrically isolated from each other. In such embodiment, an upper portion 1286 of conductive material that may be associated with an initial step in the formation of the electrode (WL1) over the base region may be removed. In some methods, for example, it may be removed using a planarization procedure such as chemical mechanical planarization (CMP). Dielectric cap 1287 (e.g., oxide, nitride, glass, etc.) may comprise a thickness substantially greater than the thickness of sidewall dielectrics 1231, 1285. With a sufficient thickness, dielectric cap 1287 may protect fin 1281 during removal of the upper portion of conductive material 1286, e.g., by CMP planarization.

In one embodiment of the present invention, electrode 1230 may propagate a wordline control signal to assist writing/reading of the thyristor cell during access of the thyristor memory. Electrode 1283 may, in some applications, serve as a "second" gate electrode and receive a bias of a temperature dependent, adaptive voltage source (not shown). This bias received by electrode 1283 may change with respect to temperature, which in turn may further influence the gain of the bipolar component (regions 1214, 1224, 1222) of the thyristor 1202.

In further embodiments, both electrodes 1230, 1283 may receive the bias of an adaptive voltage source. As the bias changes with temperature, it may affect the distribution of carriers (minority/majority) within base region 1224 (e.g., to a central region of the fin) and may further stabilize the gain of the bipolar component of the thyristor across a temperature range. The influence of this bias on the gain of the bipolar component may further adjust (either in complimentary or subtractive provision) the effects on bias that may be due to the indium (or other high ionization energy acceptor) doping of p-base region 1224. The availability of this bias may be a design consideration regarding the distribution, concentration, or other characteristics of the indium (or other high ionization energy acceptor) dopant in p-base region 1224. Further, the source of the temperature bias may be calibrated relative to any residual stability needs across the temperature range that may not be totally compensated by the indium (or other high ionization energy acceptor) compensating effects.

As may be referenced subsequently herein, the terms "F", "minimum feature size" or "minimum independent feature size" may refer to the smallest size for an independent unit feature dimension that may be formed using an optical lithographic process, such as standard photolithography with or without assisting optical proximity correction, phase shift techniques and the like. The independent unit feature may be described as independently imaged using, e.g., standard or conventional photolithographic processes. These independent unit features may be contrasted relative to dependent features, which may not be separately imaged. For example, dependent features may be formed proximate or between, and usually with dependent relationship, to one or more independently patterned features. Such dependent feature sizes (e.g., thickness of a conformal layer or spacer) often have a dimension of magnitude less than the repetitive patterning resolution of photolithographic imaging.

For example, first and second features (the second perhaps being in paired or complimentary relationship to the first) may each be individually imaged and formed in relationship to each other via "F" (the minimum feature size) and may collectively have a dimension of 2F. In a particular embodiment, imaging techniques such as optical proximity correction (OPC) or phase shift photolithography may be used to establish, e.g., a spacing between first features, which together in combination provide combined 2F dimension for the first and second features.

The term "F" may also be used in the context of describing a repetitive unit area. For example, a unit area to a repetitive pattern may comprise a length of 2F and a width of 2F, for establishing an area of magnitude $4F^2$. In another example, the unit area may comprise a length of 2F and a width of 3F, for establishing a fundamental unit area for the pattern of magnitude $6F^2$. In particular contexts herein, a dimension may be referred to as a diameter, a width, a length, or a periodicity, which may correspond or be related to F.

According to another embodiment of the present invention, a thyristor-based semiconductor device, such as a memory cell, may be manufactured in a manner that includes forming pillars with sidewalls that may define (per a cross-sectional and side view) a trench that electrically isolates a vertically aligned columnar thyristor. A trench may be formed in the device using conventional methods, such as patterning by a mask over semiconductor substrate (e.g., bulk silicon) and subsequently etching the trench at a portion of the substrate that is exposed via the patterned mask. An electrically insulative material may be formed in the trench, and a portion of the device adjacent the trench may be implanted to form the body of a thyristor. In one particular implementation, the portions of the device implanted may include a portion laterally outward from the trench. A control port, such as an electrode may be capacitively-coupled to one of the contiguous regions (e.g., base) of the thyristor and adapted to control the operation of the thyristor, for example, by effecting the switching of the thyristor. A reference voltage may be coupled to another one of the contiguous regions. In one particular implementation, the capacitor electrode is formed in the trench; and, in another implementation, the capacitor-electrode may be formed surrounding a contiguous portion (e.g., p-base) of the thyristor. The isolation trench may serve to electrically isolate the thyristor from surrounding circuitry while maintaining the ability to manufacture devices near the thyristor.

Additionally, the thyristor may be formed as part of a memory cell that uses a MOSFET as an access transistor, or pass gate, to the thyristor. A source/drain region of the access transistor may be electrically connected to an emitter region (e.g., cathode-emitter) of the thyristor. The pass gate may, for example, also include portions aligned contiguously with the thyristor. In a more specific example, when using a transistor as a pass gate, an isolation trench may be formed adjacent the pass gate and a gate for the transistor may be formed in the trench, such as by using methods similar to those to form the capacitor-electrode for the thyristor.

In another particular implementation, insulating material may prevent the control port from coupling to more than one contiguous region of the thyristor. In this manner, it is possible to couple either a lower or upper contiguous region, or to independently couple two contiguous regions using two control ports.

Figure 13:
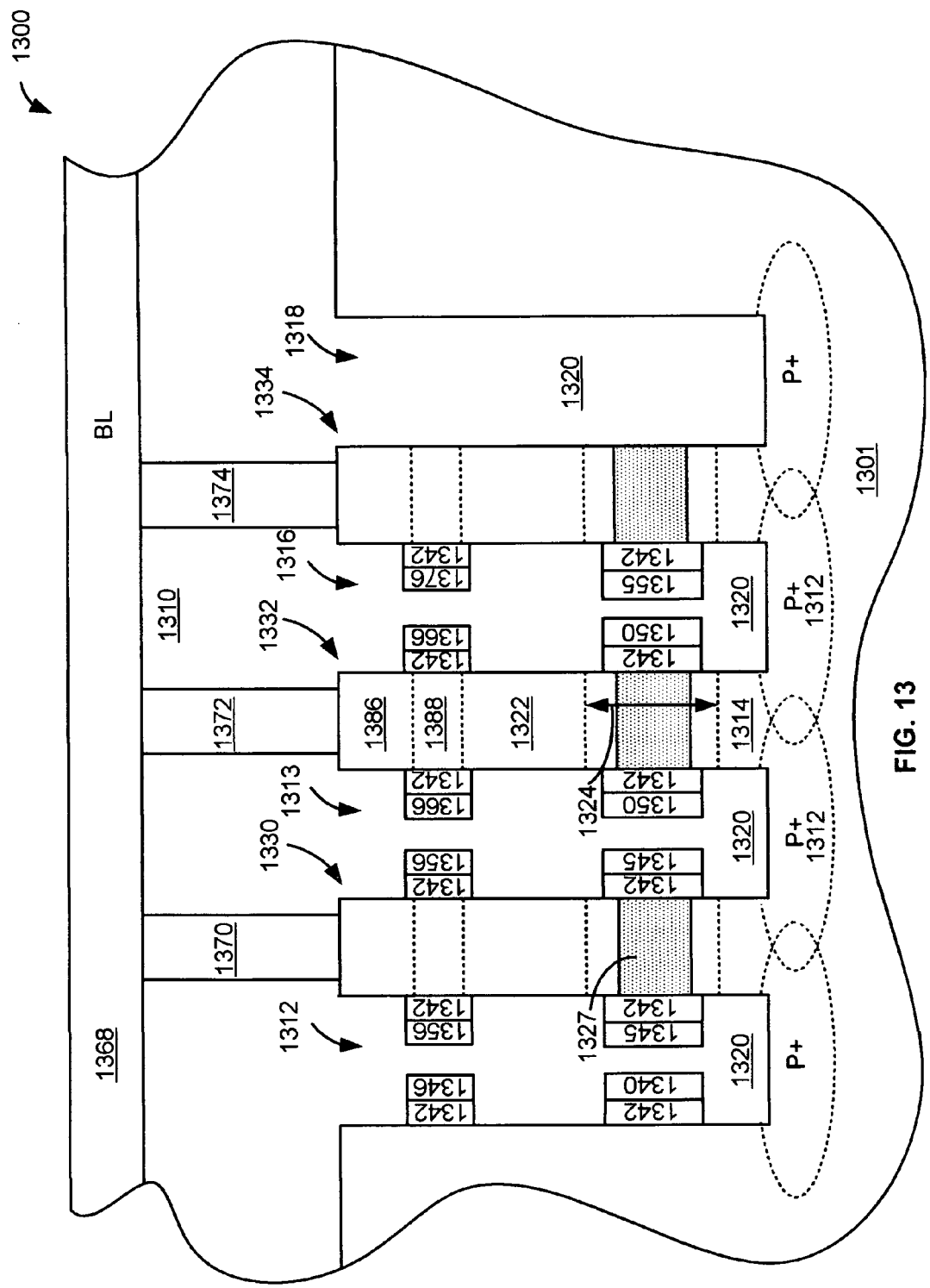
FIG. 13 is a simplified partial cross-sectional side view of a memory array consistent with another embodiment of the present invention, showing electrodes disposed on opposite sidewalls of the pillars.
Figure 14:
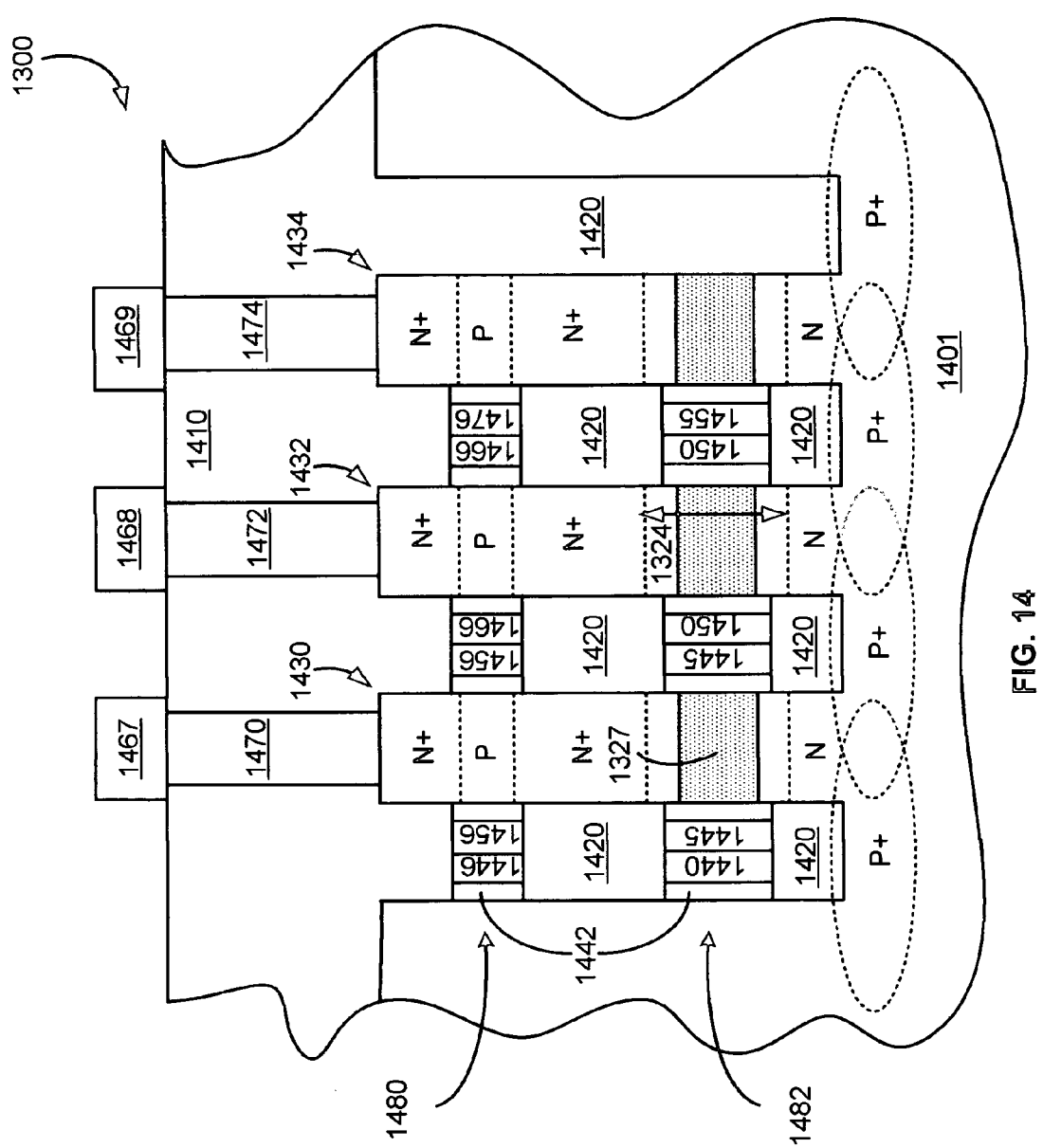
FIG. 14 is a simplified partial cross-sectional side view of a memory array consistent with an embodiment of the present invention, showing some pillars along a row sufficiently close to allow gates and electrodes to interconnect.

Referencing FIG. 13, a memory array 1300 may be viewed in cross-sectional view from a first side view direction while, in FIG. 14, it may be viewed in cross-sectional view from a second side view direction that may be perpendicular to the first direction. Further referencing FIGS. 13 and 14; memory array 1300 may comprise a plurality of pillars that define an array of rows and columns, wherein FIG. 13 may represent a view cutting through a column of the memory array 1300, and FIG. 14 may represent a view cutting through a row of the memory array 1400.

Referencing FIG. 13, conductive gates 1456 and 1466 may partially or totally encircle a circumference of body regions 1388 of respective pillars. Capacitor-electrodes, e.g., 1445 and 1450, may also partially or totally encircle a circumference of p-base regions 1324 to respective pillars 1330 and 1332. The gates may be capacitively coupled to the transistor bodies 1388; while the capacitor-electrodes 1445, 1450; likewise, may be capacitively coupled to the thyristor p-bases 1324. In some of these embodiments, at least a partial region 1327 of p-base 1324 may be doped with indium or other high ionization energy acceptor. Although, as represented in FIGS. 13 and 14, the indium doped region may be a portion entirely within the p-base 1324. In other embodiments, the indium implant may overlap a junction defined between the p-base and the cathode-emitter 1322.

Further referencing FIG. 13; the pillars 1330, 1332, and 1334 along a column may have a distance between them sufficient to prevent contact between their respective gate and capacitor-electrodes. Again, it may be noted that the pillars of the column may be associated with a common bitline 1368.

Referencing FIG. 14, the pillars 1430, 1432, 1434 of a given row may define a distance between them that is less than that defined between the pillars of a column. In a particular embodiment, the separation between pillars within the row may be sufficiently narrow to interconnect gate and capacitor electrodes along the length of the row. For example, along this row of pillars, gates 1456 and 1466 may short together, and capacitor-electrodes 1445, 1450 may also short together.

Accordingly, the gate electrodes along a row may be electrically coupled to form a common electrode of a first wordline 1480 and the capacitor-electrodes of the row may be electrically coupled to form a common electrode of a second wordline 1482. Within the row, further referencing FIGS. 13–14, the separate pillars 1430, 1432, 1434 may be electrically coupled to separate respective bitlines 1467, 1468, and 1469. Thus, the memory cell of a pillar may be operable by a combination of voltage levels on its first wordline, and its second wordline for signal propagation on separate bitlines 1467, 1468, and 1469.

Figure 15:
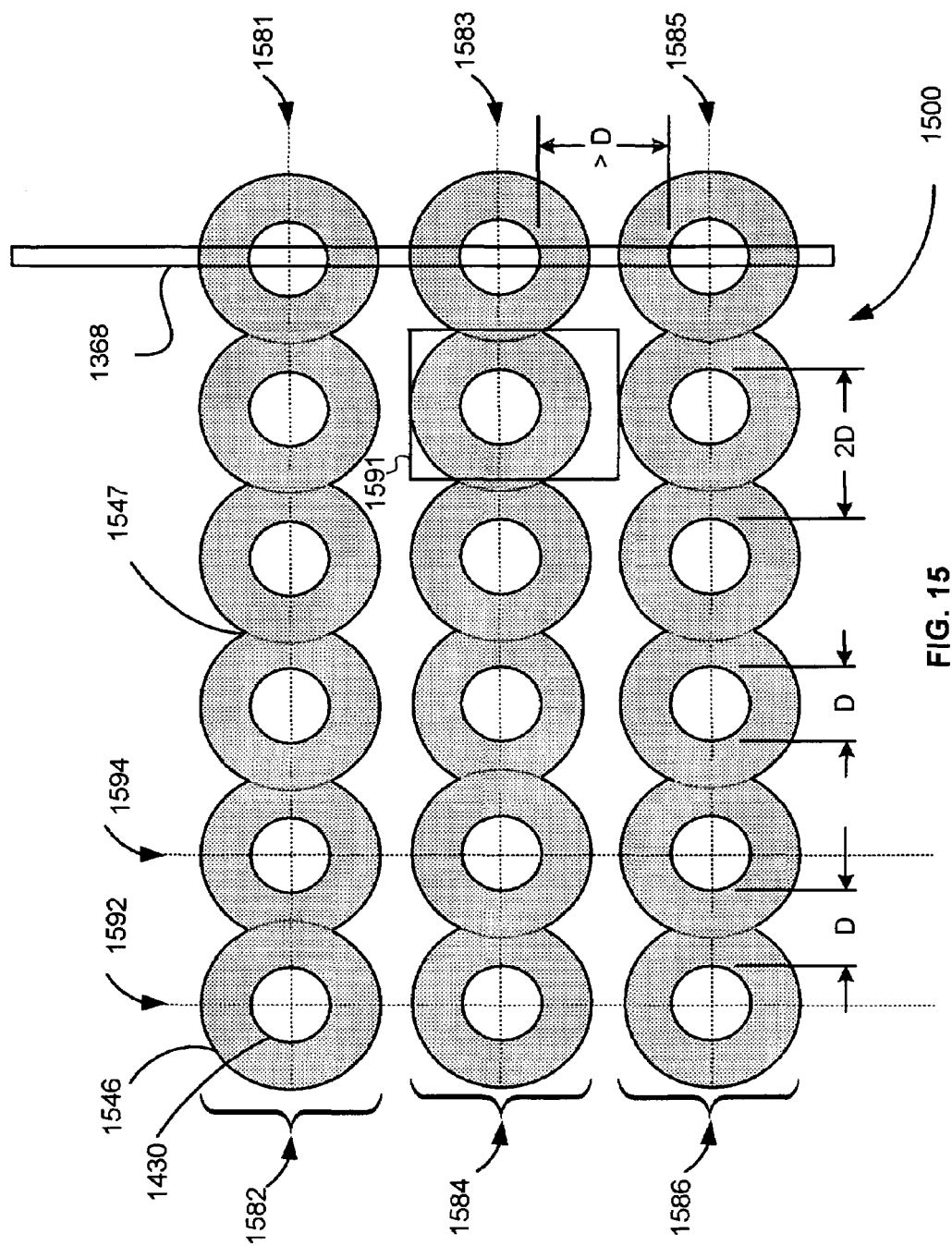
FIG. 15 is a simplified partial view of a memory array consistent with an embodiment of the present invention, showing round pillars (as seen from a top view) disposed in rows and columns, and showing conductive sleeves encircling the individual pillars shorting along a row.

Referencing FIG. 15, a thyristor-based memory array 1500 may comprise a plurality of memory cells that define rows 1581, 1583, and 1585 orthogonal to columns 1592, 1594. Conductive sleeves 1546, perhaps comprising polysilicon, may encircle and capacitively couple (via dielectric not shown) to pillars 1430. Within a given row, the sleeves 1546 may short together (for example, short 1547) to define common electrodes of wordlines 1582, 1584, 1586, respectively. Conversely, within a given column 1592, 1594, an interspacing may avoid inter-coupling of the sleeves that may be associated with separate wordlines.

Further referencing FIG. 15, in accordance with one embodiment; pillars 1430 may comprise a round circumference of diameter D. Within the rows 1581, 1583, 1585 the pillars 1430 may be laterally separated by a distance as great as D. In a column, on the other hand, the pillars may be spaced sufficiently great to prevent the sleeves 1546 of the different wordlines from shorting together. In a particular embodiment, a spatial periodicity may extend laterally along a row with spatial period (pillar and gap) as great as 2D.

Within the columns 1792, 1794 the pillars 1430 may be separated by a distance greater than D, and perhaps as great as 2D, which may be sufficiently great to prevent the sleeves 1746 from shorting together. In a particular embodiment, the spatial periodicity longitudinally along a column with a spatial period (pillar and gap) greater than 2D and perhaps as great as 3D. Accordingly, the area of a memory cell 1791, in such embodiments, may be less than $6D^2$.

In a further embodiment, D may be representative of a minimum dimension per a given (photolithographic) technology, which could comprise, for example, a value of 130 nanometers.

Figure 16A:
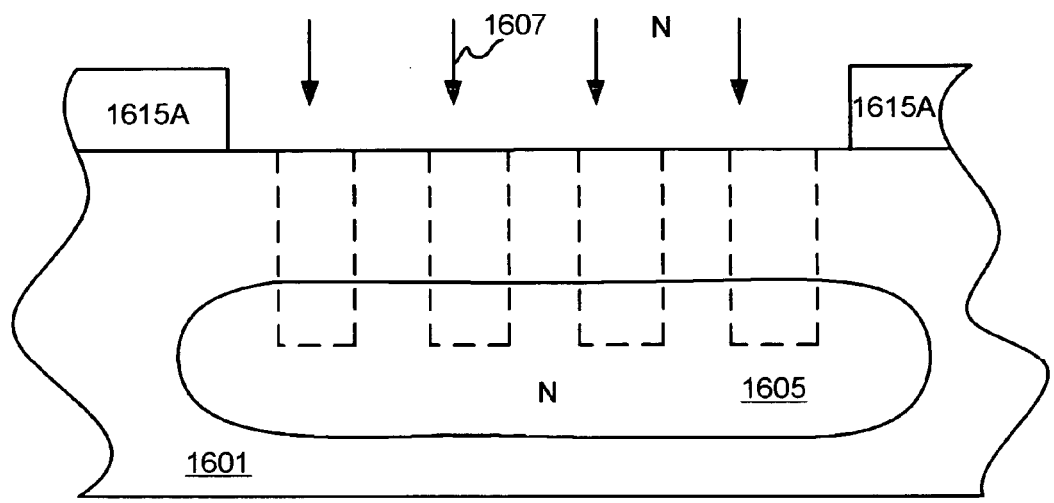
FIG. 16A is a simplified partial cross-sectional view useful to describe a method of processing a semiconductor device for an embodiment of the present invention, in an early stage of fabrication showing the formation of a buried implant.

In accordance with an embodiment of fabrication for such pillar-structured thyristor-based memory, referencing FIG. 16A, dopant implants may be implanted (e.g., via a retrograde implant procedure) into a substrate 1601 to form buried layer 1605.

Further referencing FIG. 16A, semiconductor substrate 1601 may be masked with a layer with protective material 1615A patterned to define a window and exposing an area of the semiconductor substrate 1601 to be associated with an array of pillars for the memory array. N-type dopant 1607 may be directed through the window defined by the mask 1615A and with sufficient energy to define a buried implant region 1605 to extend beneath the desired pillars.

Figure 16B:
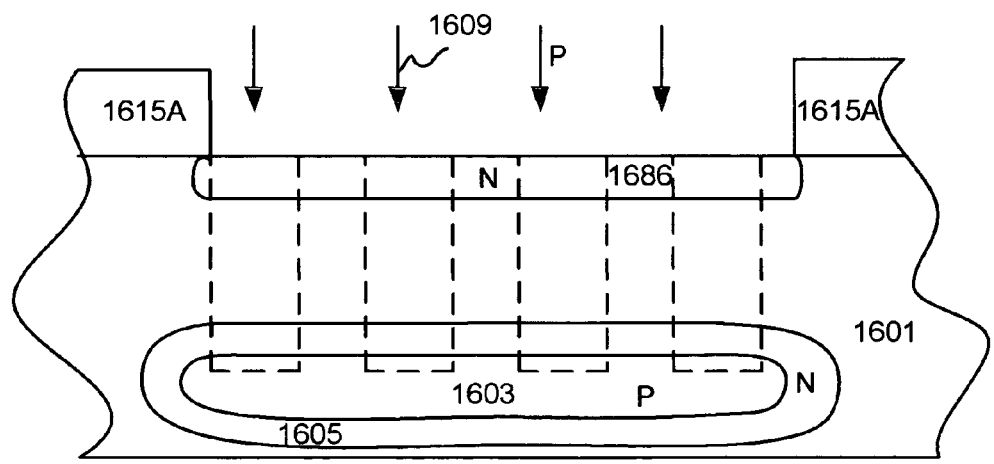
FIG. 16B is a simplified partial cross-sectional view of the semiconductor device of FIG. 16A in another stage of fabrication showing the formation of another buried implant.

Referencing FIG. 16B, p-type dopant 1609 may then be driven into the semiconductor substrate 1601 with energy sufficient to define a buried p-region 1603 with an average depth slightly less than the previously discussed buried n-region 1605. In a particular embodiment, buried p-region 1603 will be used for propagating a reference voltage to anode-emitter regions for thyristors to be formed in pillars for the array. Further referencing FIG. 16B, n-type dopant may then be diffused into an upper surface region 1686 of the substrate with a dosage appropriate for source/drain regions for an access transistor.

Figure 16C:
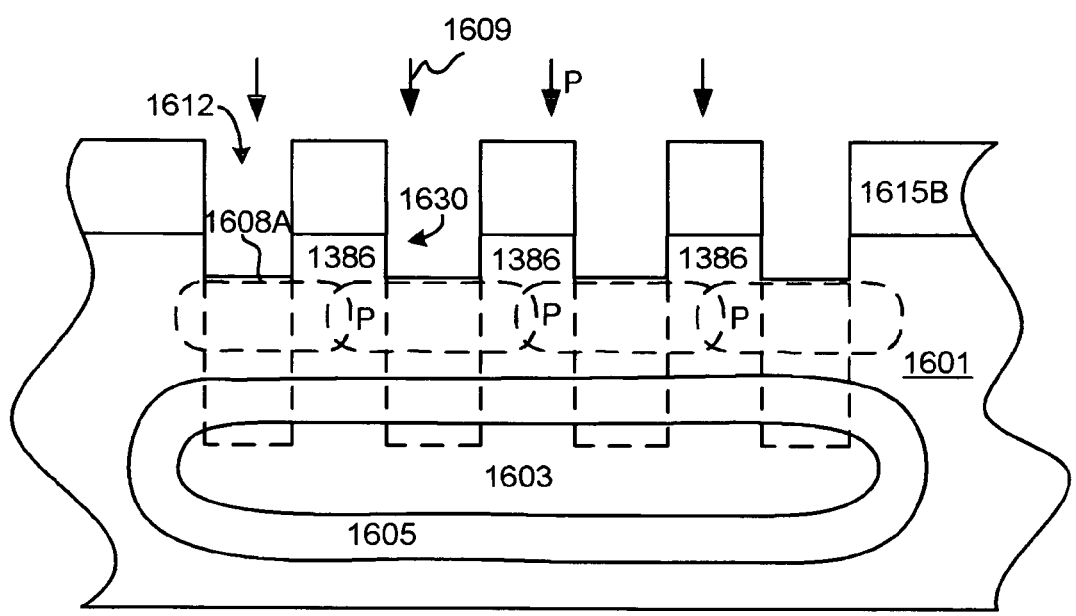
FIG. 16C is a simplified partial cross-sectional view of the semiconductor device of FIG. 16A in another stage of fabrication showing the formation of pillar sidewalls and of body regions of intended transistors to be formed in the pillars.

Next, referencing FIG. 16C, new masking material 1615B may be deposited and patterned over the semiconductor substrate 1601. In one example, the mask material may comprise photoresist that may be patterned using, e.g., photolithographic procedures for defining openings there through and to expose regions of the substrate for the formation of trenches. The resulting protective elements of patterned mask 1615B may be described alternatively as islands of protective material disposed over regions of the semiconductor substrate to protect sites for the formation of pillars.

Using mask 1615B as an etch block, further referencing FIG. 16C, exposed regions of the semiconductor substrate 1601 may be etched to form a trench (e.g., 1612) and lower a floor 1608A for the trench to an elevation between the N+ source/drain region 1386 and a desired p-body region for the access transistors within the pillars. Next, p-type dopant 1609 may be implanted with energy sufficient to provide a lateral scattering (per alternative description of lateral straggle) of the dopant at least halfway through the diameters of the pillars (e.g., 1630). Additionally, the dosage of p-type dopant 1609 may define some of the channel characteristics for the access transistors.

Figure 16D:
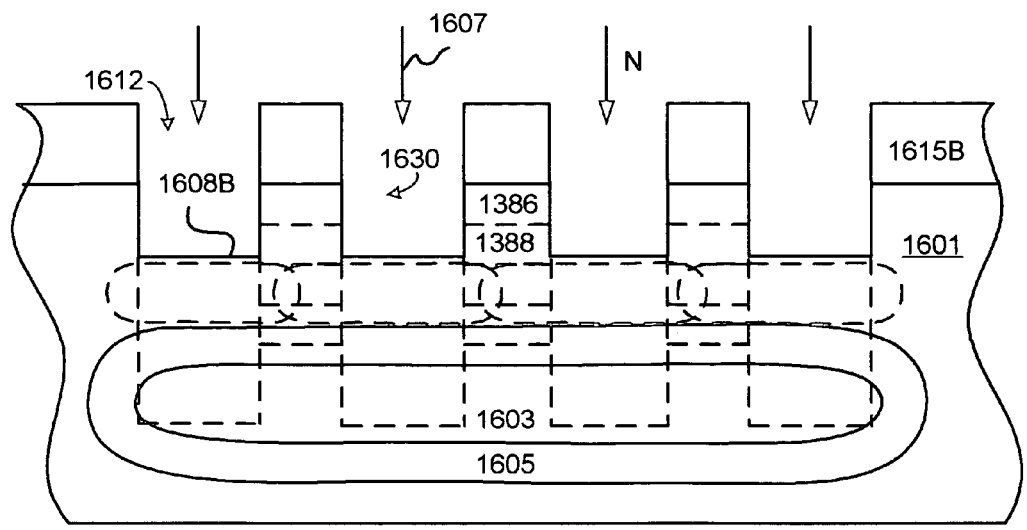
FIG. 16D is a simplified partial cross-sectional view of the semiconductor device of FIG. 16A in another stage of fabrication showing the formation of source and drain regions of intended transistors to be formed in the pillars.
Figure 16E:
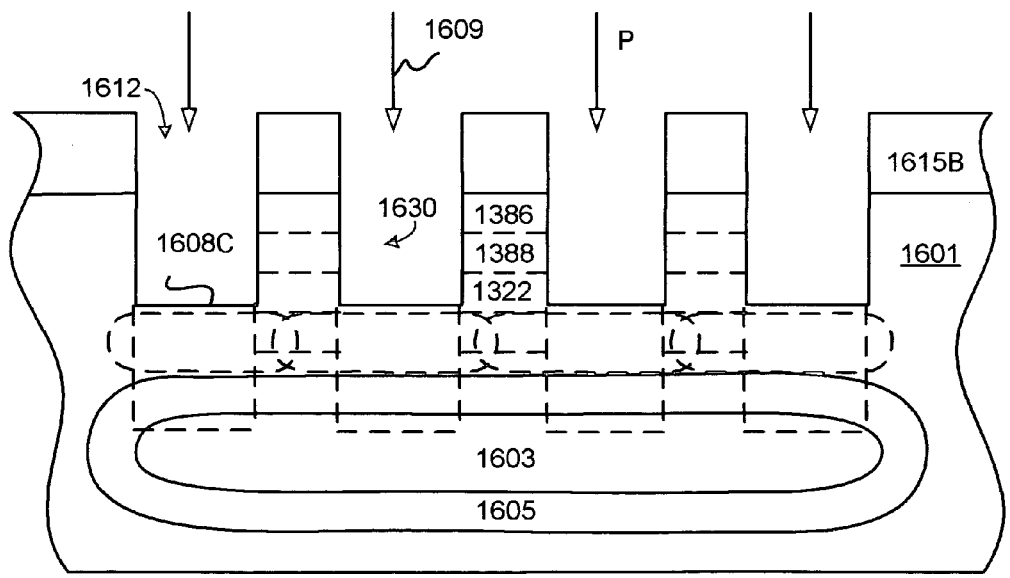
FIG. 16E is a simplified partial cross-sectional view of the semiconductor device of FIG. 16A in another stage of fabrication showing the formation of a base region of intended thyristors to be formed in the pillars.

Next, referencing FIGS. 16D and 16E, exposed regions of the semiconductor material defined by the trench 1612 may be further etched to lower the floor 1608B to an elevation between the p-body region 1388 and the desired drain/source (or cathode-emitter) region. This etch may be performed anisotropically while using mask material 1615B as a protective pattern over pillars (e.g., 1630) and other peripheral regions of the semiconductor substrate 1601. Upon lowering the trench floor 1608B to an elevation at the boundary between the p-body 1388 and drain/source regions, n-type dopant 1607 may be implanted downwardly into the floors or exposed regions of semiconductor material 1601 and with energy sufficient to scatter dopant laterally (via the lateral straggle) to implant the drain/source or cathode-emitter regions for the pillars.

Referencing FIG. 16E, further etching may then be performed to lower the floor 1608C of the trenches (e.g., 1612) down to an elevation between the cathode-emitter 1322 and the desired p-base region for the thyristors. P-type dopant 1609 may then be implanted into exposed regions of the substrate with energy sufficient to scatter dopant laterally and to dope the desired p-base region 1324 for the thyristor device within the pillars.

Further, per this embodiment, indium may be implanted with energy sufficient to scatter laterally into the width of the desired pillar. This may, thus, implant at least a portion of the p-base 1324 with the temperature compensating effective indium (or high ionization energy acceptor). In one embodiment, the indium may be implanted with energy that may allow the indium to penetrate a partial or lateral extent associated with the p-type dopant (boron) therefore. This may be effective to form the indium implant region 1327 for the thyristor as described earlier with reference to FIG. 13.

Figure 16F:
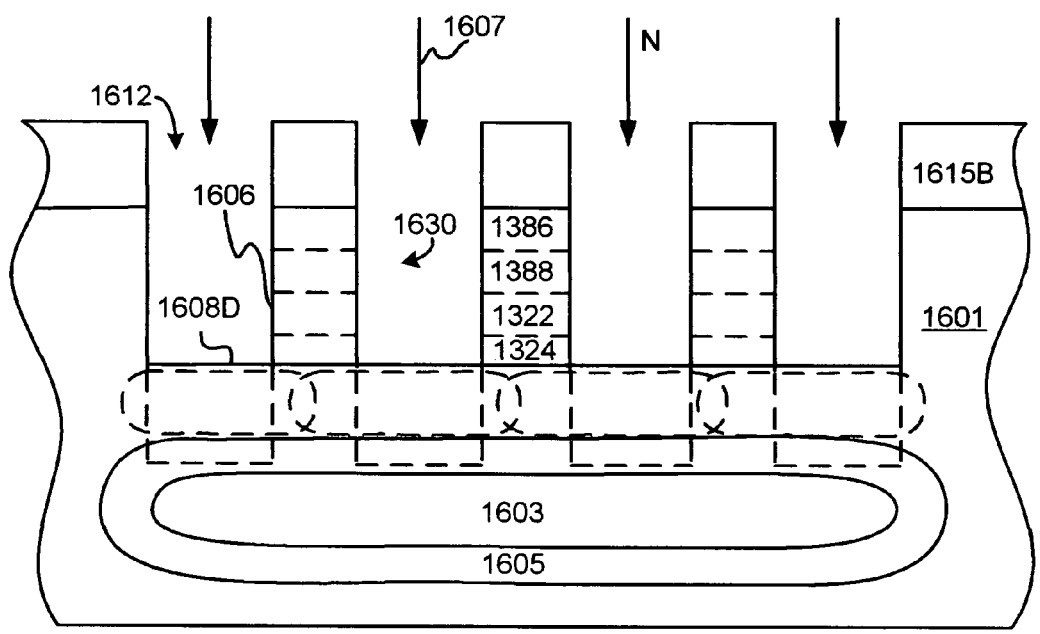
FIG. 16F is a simplified partial cross-sectional view of the semiconductor device of FIG. 16A in another stage of fabrication showing the formation of another base region of intended thyristors to be formed in the pillars.

Moving forward, with reference to FIG. 16F, additional anisotropic etching may be performed to further recess the trench floor 1608D to an elevation between the p-base region 1324 and the desired n-base region for the thyristors. This may further define sidewalls 1606 for the pillars 1630. N-type dopant 1607 may then be directed to exposed floor regions of the semiconductor substrate, which may impact floor 1608D of the trench regions and scatter laterally to implant (using the lateral straggle technique) the desired n-base regions for the thyristors for the pillars.

As previously discussed with reference to FIGS. 5A and 5B, the N-type dopant 1607 may include a high-ionization energy donor. In particular embodiments, the high ionization energy donor may include at least one of the group consisting of bismuth, sulfur, selenium, and tellurium.

Figure 16G:
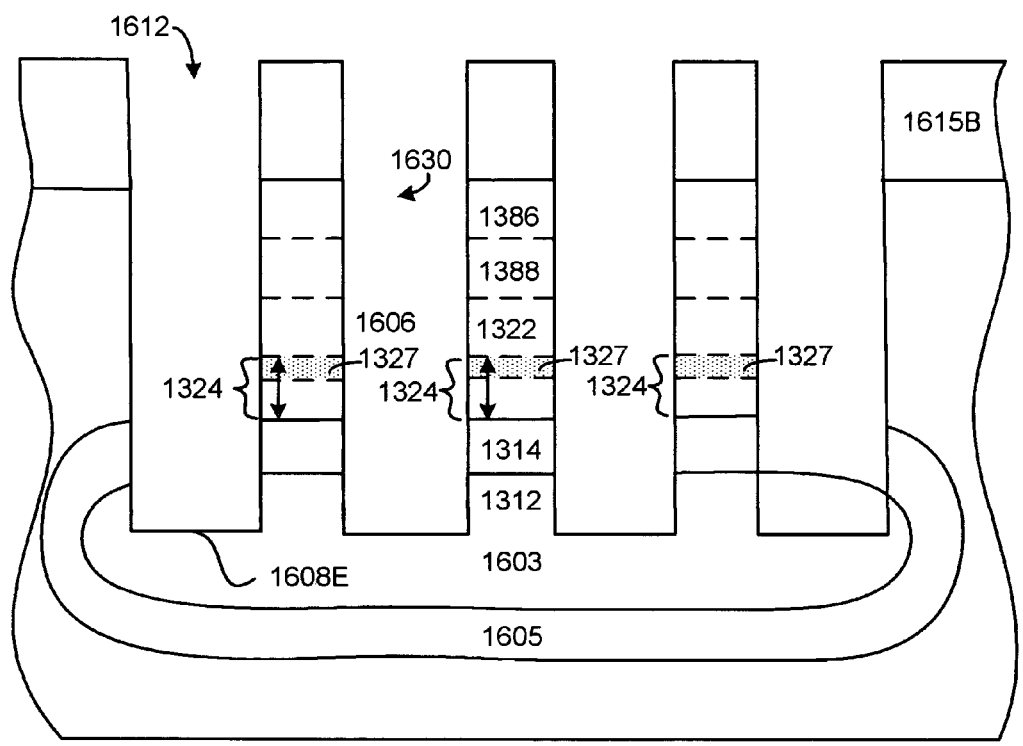
FIG. 16G is a simplified partial cross-sectional view of the semiconductor device of FIG. 16A in another stage of fabrication showing the extension of trench floors into buried anode-emitter regions for thyristors.

Referencing FIG. 16G, upon implanting the n-base regions for the thyristor, the trench regions may be further etched anisotropically to lower the floors 1608E of the trenches downward and into the buried p-region 1603. This may be understood to define sidewalls (e.g., 1606) of the pillar 1630 about the n-base region 1314 and a portion for the p-anode-emitter region 1603 for the thyristor device. Thus, a pillar of semiconductor material within the memory array may comprise alternating layers of n-p-n-p-n-p dopant regions 1386, 1388, 1322, 1324, 1314, 1312, respectively, for portions of an access transistor and thyristor of a memory device. Further, at least a portion 1327 of the p-base to the thyristor may have the indium (or other high ionization energy acceptor) dopant.

Further disclosure regarding formation of pillar-type thyristor-based memory may be found in U.S. patent application Ser. No. 10/884,337; the disclosure of which is hereby incorporated by reference in its entirety.

Figure 17A:
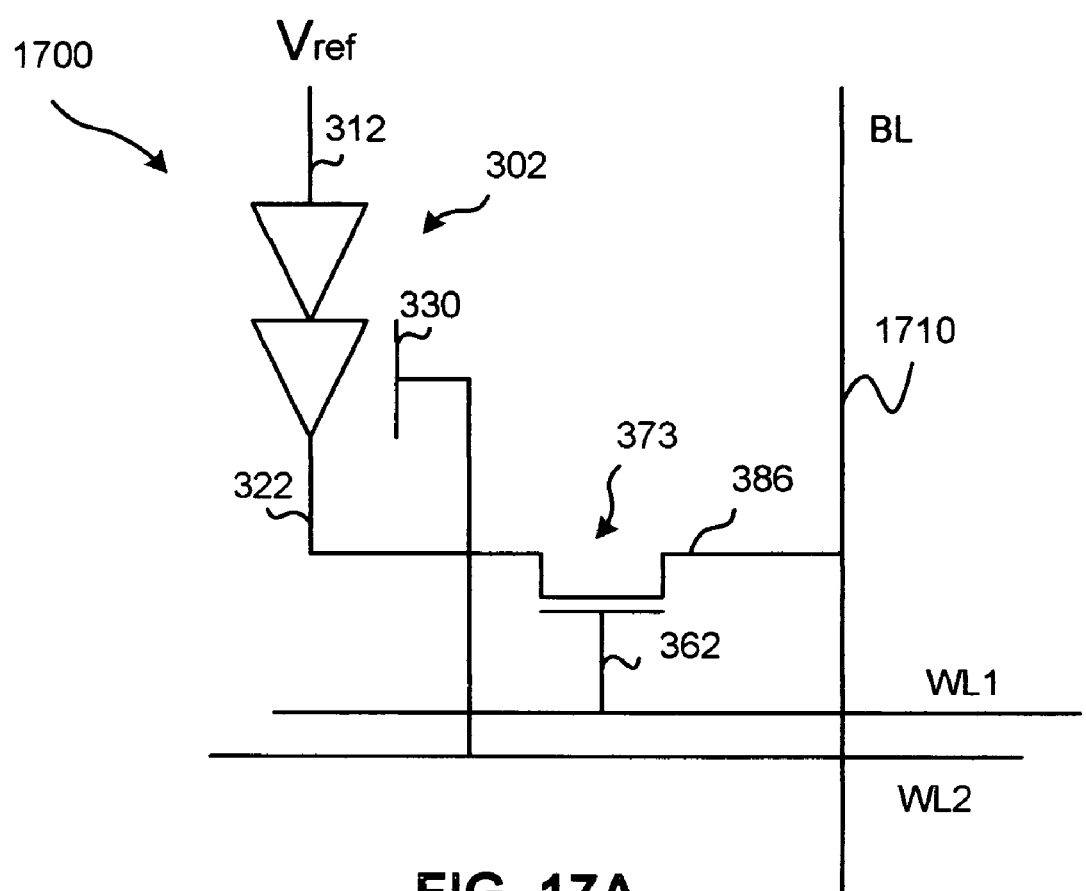
FIG. 17A is a schematic diagram of a portion of a memory array comprising a memory according to certain embodiments of the present invention.
Figure 17B:
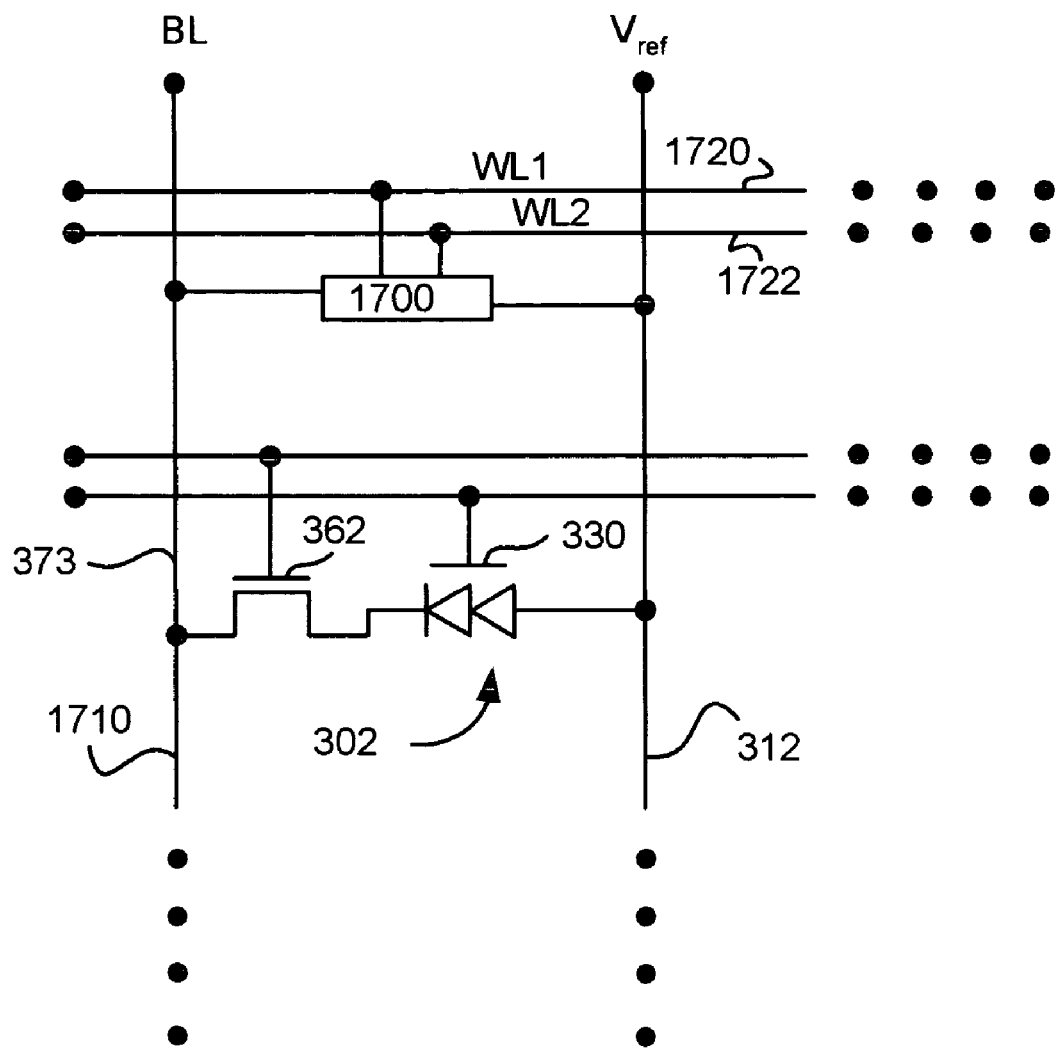
FIG. 17B is a schematic diagram of a portion of a memory array comprising two memory cells according to certain embodiments of the present invention.

Referencing FIGS. 17A and 17B, a semiconductor memory device 1702 (FIG. 17B) may comprise a plurality of thyristor based memory 1700, which may be disposed collectively as an array of rows and columns. The cells 1700 may comprise thyristor-based elements corresponding to embodiments disclosed previously herein. Bitlines 1710 within the array may be coupled to source/drain regions 386 of access transistors 373. Gates 362 of respective access transistors 373 may be coupled to associate access wordlines 1720 (WL1). Electrodes 330 of respective thyristor devices 302 may be coupled to respective wordline 1722 (WL2) within the array of semiconductor device 1702. By appropriate control of these wordlines, the contents of the various thyristor cells 1700 may be selectively accessed for reading or writing data via the bitlines 1710.

To assist the stability and reliability of the memory cells 1700 of the memory array 1702 relative to temperature, indium (or other high ionization energy acceptor) doping of p-base regions of the thyristors 302 may provide temperature compensation effects to stabilize a gain that may otherwise increase or decrease as a function of temperature. The indium (or other high ionization energy acceptor) doping of the p-base regions may serve to stabilize operability for the memory array 1702 over a broad range of temperatures.

Figure 18A:
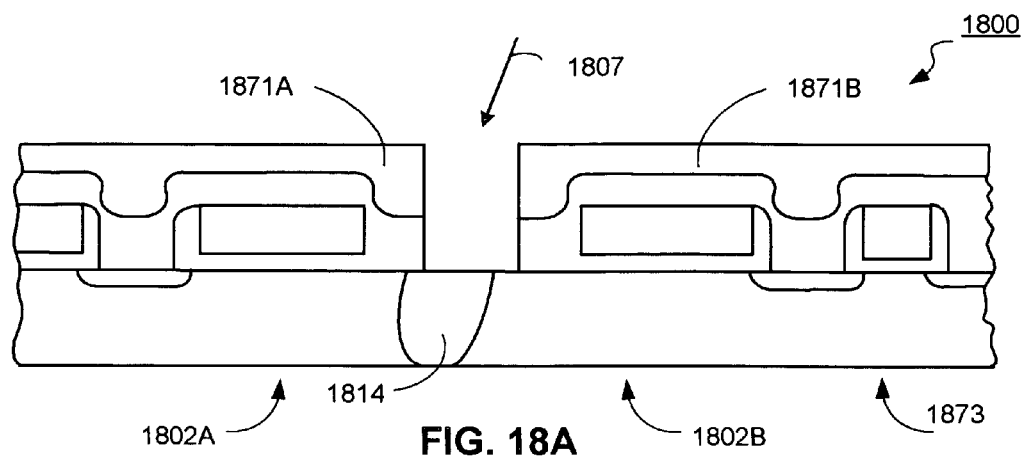
FIGS. 18A and 18B are simplified cross-sectional views showing two stages of memory fabrication, each showing an angular implant of a base region with a dopant of high ionization energy characteristic.
Figure 18B:
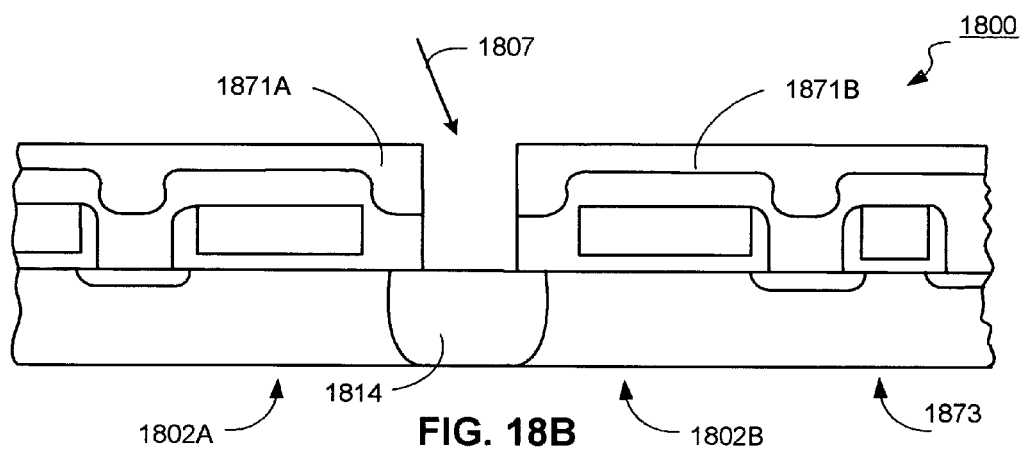
Figure 18C:
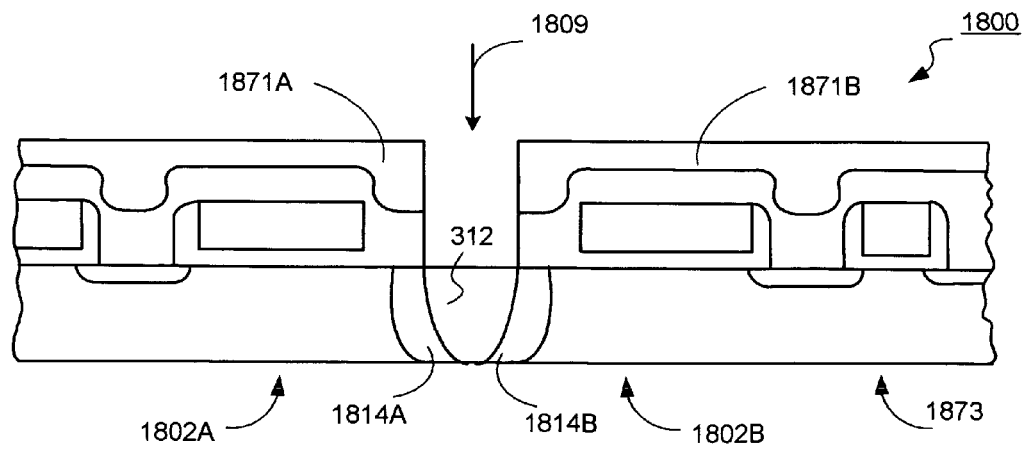
FIG. 18C is a simplified cross-sectional view showing a further stage of the memory fabrication of FIGS. 18A and 18B, and showing the implant for an emitter region.

Referencing FIGS. 18A, 18B, 18C, an n-base region may be formed to comprise a high ionization energy n-type dopant (e.g., bismuth). Referencing FIG. 18A, a semiconductor device 1800 may comprise two mirror-image PNPN thyristor regions 1802A, 1802B, in an early stage of fabrication according to a method consistent with an embodiment of the present invention. In a particular embodiment, at least one of the mirror-image thyristors (e.g., 1802B) may be electrically coupled in series to an NMOS 1873. An n-base region 1814 of a first of the mirror-image thyristors 1802A may be formed with an extent defined by an angular implant of dopant 1807 and a window opening in mask 1871A, 1871B. The dopant 1807 may include a high-ionization energy donor such as bismuth, sulfur, selenium, and tellurium.

Referencing FIG. 18B, the extent for the n-base region 1814 to be used for the other 1802B of mirror-image thyristors may be defined by a complementary angled implant and an opposite edge of the window opening in mask 1817. As discussed with reference to FIG. 18A, the dopant 1807 may include a high-ionization energy donor such as bismuth.

Referencing FIG. 18C, p-type dopant 1809 may then be implanted between the n-base regions 1814A, 1814B of the mirror-image thyristors 1802A, 1802B to form anode-emitter region 312 of each of the mirror-image thyristors 1802A, 1802B. A first n-base region 1814A, thus, may be defined for the first of the mirror-image thyristors 1802A and a second n-base region may be defined for the second of the mirror-image thyristors 1802B.

As previously discussed with reference to FIGS. 5A and 5B, the high-ionization energy donor may assist more stable operation of the thyristors 1802A, 1802B over a range of temperatures. In another embodiment, the doping of the n-base regions 1814A, 1814B, may be combined with methods described above for doping a p-base region with a high-ionization energy acceptor.

Figure 19:
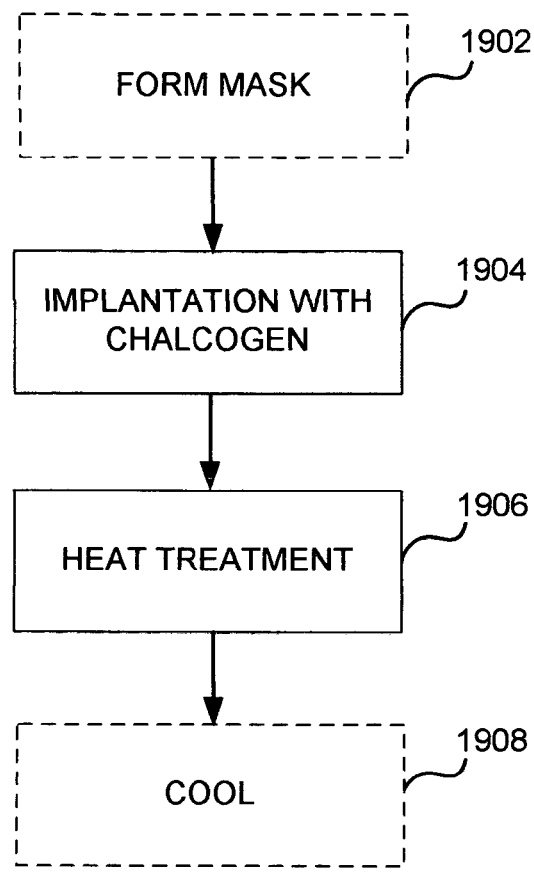
FIG. 19 is a simplified process flow diagram for a method of forming a thyristor-based memory device in accordance with another embodiment for implanting a chalcogen and providing heat treatment.

Referencing FIG. 19, a method 1900 of fabricating a semiconductor device in accordance with particular embodiments of the present invention may comprise implanting a region for an n-base with a chalcogen or other high-ionization energy donor and forming high-ionization energy pairs and/or complexes (e.g., $S_2$, $Se_2$, $Se_3$, $Se_n$, $Te_2$ etc.) of the donors. In a particular embodiment, the implanted region may be formed to comprise isolated chologens such as S, Se, Te; pairs such as $S_2$, $Se_2$, $Te_2$; and chalogen complexes such as $Se_6$. In another particular embodiment, such as when a chalcogen is implanted into a p-type substrate (see discussion below), donor pairs and/or complexes may be formed comprising chalcogen-acceptor pairs. In a further embodiments, reactions forming pairs and/or complexes (i.e., products) may be in equilibrium, in accordance with a corresponding equilibrium constant $K_c$, with reverse reactions forming reactants (e.g., isolated atoms, pairs, smaller complexes):

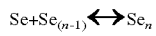

$$Se+Se_{(n-1)} \leftrightarrow Se_n$$

In another particular embodiment, a pair and/or complex (e.g., $Se_n$, $Te_n$, an acceptor-chalcogen pair, etc.) may comprise a lower ionization energy as compared to an isolated chalcogen atom (e.g., Se, Te). Thus, in particular embodiments in which a lower ionization energy may be desired, pairs and/or complexes may be formed.

Further referencing FIG. 19, a method 1900 of forming pairs and/or complexes that act as n-type dopants may optionally comprise forming a mask (Process Block 1902) defining a window for implanting into a region for an n-type region such as an n-base. In particular embodiments, the mask may be formed to define a window for an angled implant of a region for an n-base as described with reference to FIGS. 18A–C. In other particular embodiments, the window for the angled implant may be formed similarly to that for angled implant of a high-ionization energy acceptor into a p-base, as described with reference to FIGS. 8, 9A–C. In yet another embodiments, the mask may be formed to define a window for a vertical implant similar to that for implanting a high-ionization energy acceptor, as described with reference to FIGS. 10, 11A–D.

A region exposed by a window may then be implanted with ions (Process Block 1904) of chalcogens such as sulfur, selenium or tellurium. In a particular embodiment, the implantation energy may be approximately 70 keV or other energy dependent upon mass of the ion and the desired penetration depth. The dose may range between approximately $1 \times 10^{12}$ to approximately $1 \times 10^{15}$ cm$^{-2}$. In another particular embodiment, a chalcogen concentration of perhaps $1 \times 10^{18}$ cm$^{-3}$ may be effected to stimulate the formation of complexes with 3 or more chalcogen atoms.

In yet other particular embodiments, the implantation may be performed into a p-doped region (e.g., silicon implanted with boron: p-Si:B), changing the polarity to n-type. In another particular embodiment, the implantation may be performed into an n-doped region (e.g., silicon implanted with phosphorus: n-Si:P). In a further embodiment, the implantation may be performed through an "insulating layer" (e.g., silicon dioxide) to achieve a particular dopant distribution profile.

A heat treatment or anneal (Process Block 1906) may be performed to diffuse the implanted ions and to stimulate formation of pairs and/or complexes. In particular embodiments, the temperature and the length of time used for the heat treatment may vary. For example, in various embodiments the temperature may range from approximately 1300° C. to approximately 500° C. In particular embodiments, the length of the treatment may vary from approximately many hours (e.g., approximately 150 hours) to perhaps 10 minutes. In some embodiments, lower temperature heat treatments may favor the formation of pairs and/or complexes. In particular embodiments, the formation of combinations of two or more ions (e.g., pairs and/or complexes) may be stimulated with heat treatments or anneals with a temperature less than 650° C. In a further particular embodiment, the formation of larger complexes may be stimulated with annealing at low temperatures (e.g., 550° C. or less) and long length of treatment (e.g., 150 hours or more).

In further embodiments, an optional rapid cooling procedure (Process Block 1908) may be performed. For example, cooling may comprise an ice quench. In a further particular embodiment, a high temperature anneal (e.g., 1200° C.) with an ice quench may result in less pair and/or complex formation. In yet other embodiments, furnace cooling may be used, perhaps resulting in greater complex formation. It may be theorized that, in one embodiment, the furnace cooling allows the implanted region to experience low annealing temperatures (e.g., below approximately 600 to 700° C.), which may favor the formation of larger complexes.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of P-N sections in the thyristor device; and interchanging P and N regions in the device structures and/or using P-MOSFETS rather than N-MOSFETS. Such, exemplary modifications and changes would not depart from the true spirit and scope of the present invention that may be set forth in the following claims.

What is claimed is:

1. A method of fabricating a thyristor-based memory comprising:

implanting dopant characterized as a high ionization energy acceptor into a region of semiconductor material for the thyristor-based memory; and in which the implanting incorporates an angled implant and penetrates with some of the acceptor dopant, at least a portion of a p-base region to neighbor the cathode-emitter region.

2. The method of claim 1, further comprising forming a mask to protect at least part of the thyristor region and to expose other regions, the angled implant with the acceptor dopant into the exposed regions penetrating select regions of the p-base region dependent on at least the angle of implant and a boundary of the mask's window.

3. The method of claim 1, in which the implanting of high ionization energy acceptor dopant penetrates regions of the p-base region for combined integration therein together with another p-type dopant.

4. The method of claim 3, in which:
the implanting and penetration into the p-base region combines the high ionization energy acceptor dopant together with boron as the other p-type dopant; and
the angled implant with the acceptor dopant penetrates select regions of the p-base region dependent on at least the angle of the implant and a boundary of the mask's window.

5. The method of claim 4, further comprising forming an electrode capacitively coupled to at least a portion of the p-base region.

6. The method of claim 5, further comprising forming sidewall spacers against sidewalls of the electrode to define at least in part a portion of the mask.

7. The method of claim 6, in which the angled implant comprises implanting the acceptor using an angle of incidence less than 85 degrees and greater than 45 degrees relative to the exposed surface of the cathode-emitter region.

8. The method of claim 7, the angled implant to implant at least a portion of the p-base region to establish a concentration of acceptor dopant therein of at least $1\times10^{15}$ acceptor atoms $cm^{-3}$.

9. The method of claim 5, the forming of the electrode to define, at least in part, a portion of the mask.

10. The method of claim 9, further comprising, after the angled implant, forming sidewall spacers against sidewalls of the electrode.

11. A method of fabricating a thyristor-based memory comprising:
forming anode-emitter, n-base, p-base and cathode-emitter regions for a thyristor;
implanting at least a portion of the region for the n-base with high ionization energy donor; and
further comprising forming a PMOSFET access transistor with its source/drain region electrically in common with the anode-emitter region of the thyristor;
in which the forming the regions electrically in common comprises electrically interconnecting the regions by an interconnect.

12. A method of fabricating a thyristor-based memory comprising:
forming anode-emitter, n-base, p-base and cathode-emitter regions for a thyristor; and
implanting at least a portion of the region for the n-base with high ionization energy donor;
in which the implanting uses bismuth for the high ionization energy donor.

13. A method of fabricating a thyristor-based memory comprising:
forming anode-emitter, n-base, p-base and cathode-emitter regions for a thyristor; and
implanting at least a portion of the region for the n-base with high ionization energy donor;
in which the implanting uses chalcogen for the high ionization energy donor.

14. The method of claim 13, in which:
the chalcogens comprise at least one of the group consisting of S, Se, and Te; and
the method further comprises heating the chalcogen implanted to form at least one of the group consisting of $S_2$, $Se_2$, $Te_2$, a complex of sulfur, a complex of selenium and a complex of tellurium.

15. The method of claim 13, in which the implanting uses an implantation energy of between approximately 50 and 200 kev.

16. The method of claim 13, in which the implanting uses a dose of chalcogen ions between approximately $1\times10^{12}$ and $1\times10^{15}$ per $cm^2$.

17. A method of fabricating a thyristor-based memory comprising:
forming anode-emitter, n-base, phase and cathode-emitter regions for a thyristor;
implanting at least a portion of the region for the n-base with high ionization energy donor; and
implanting at least a portion of the p-base region for the thyristor with a high ionization energy acceptor.

18. The method of claim 17, further comprising:
forming a NMOSFET access transistor with a drain/source region electrically in common with the cathode-emitter region of the thyristor.

19. The method of claim 18 in which forming the regions electrically in common comprises forming the regions physically in common.

20. A method of fabricating a thyristor-based memory comprising:
implanting an n-base region for a thyristor with chalcogen; and
annealing the region implanted to react the chalcogen and form at least one of a pair and a complex.

21. The method of claim 20, further comprising:
forming a mask with a window to be used during the implanting of the chalcogen; and
the implanting with the chalcogen comprises:
directing chalcogen ions toward exposed regions of semiconductor material as defined by the mask window;
the directing to use a direction of incidence for the chalcogen ions that defines an acute angle of incidence relative to a surface of the exposed region; and
penetrating the chalcogen into the exposed regions and defining a lateral extent of the ions dependent on the acute angle of incidence, the peripheral edge of the mask window and the energy used for the implanting, the lateral extent to extend laterally beneath and beyond the peripheral edge of the mask window.

22. A method of fabricating a thyristor-based memory comprising:
implanting an n-base region for a thyristor with chalcogen; and
in which the implanting uses a dose of chalcogen ions sufficient to form the region with n-type conductivity.

23. The method of claim 22, further comprising annealing the region to react at least some of the implanted chalcogen and forming at least one of pairs and complexes.

24. The method of claim 23, further comprising implanting the n-base region with acceptor ions, the annealing to comprise reacting at least some of the implanted chalcogen and acceptor to form chalcogen-acceptor pairs.

* * * * *